(12) United States Patent
Soda

(10) Patent No.: US 11,521,557 B2
(45) Date of Patent: Dec. 6, 2022

(54) DISPLAY APPARATUS, INFORMATION DISPLAY APPARATUS, PHOTOELECTRIC CONVERSION APPARATUS, ELECTRONIC APPARATUS, LIGHTING APPARATUS, AND MOBILE BODY

(71) Applicant: CANON KABUSHIKI KAISHA, Tokyo (JP)

(72) Inventor: Takehiko Soda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/083,105

(22) Filed: Oct. 28, 2020

(65) Prior Publication Data

US 2021/0134231 A1    May 6, 2021

(30) Foreign Application Priority Data

Oct. 30, 2019    (JP) .............................. JP2019-198013

(51) Int. Cl.
*G09G 3/3233*    (2016.01)
*G09G 3/3225*    (2016.01)
(Continued)

(52) U.S. Cl.
CPC ........... *G09G 3/3275* (2013.01); *G06F 3/013* (2013.01); *G09G 3/3233* (2013.01);
(Continued)

(58) Field of Classification Search
CPC ............... G09G 3/3275; G09G 3/3233; G09G 2300/0847; G09G 2300/0819;
(Continued)

(56) References Cited

U.S. PATENT DOCUMENTS

2003/0142052 A1\* 7/2003 Matsumoto .......... G09G 3/3648
345/87
2003/0222576 A1\* 12/2003 Lu ......................... H01L 27/322
313/504
(Continued)

FOREIGN PATENT DOCUMENTS

JP    2005-222024 A    8/2005
JP    2006-163045 A    6/2006
(Continued)

*Primary Examiner* — Mihir K Rayan
(74) *Attorney, Agent, or Firm* — Canon U.S.A., Inc. IP Division

(57) ABSTRACT

A display apparatus includes a data signal output unit, a first light emitting element, a first transistor, a first capacitive element, a second transistor, and a third transistor. The first transistor is connected to the first light emitting element and includes a gate. The first capacitive element includes a first node and a second node. The second transistor is provided on a first input path through which a signal from the data signal output unit is input to the gate. The third transistor is provided on a second input path through which a signal from the data signal output unit is input to the gate and which is different from the first input path. The first node is connected to the second transistor, the third transistor, and the gate. The second node is configured to be supplied with a power source potential.

32 Claims, 16 Drawing Sheets

(51) Int. Cl.
*G09G 3/3275* (2016.01)
*H01L 27/32* (2006.01)
*G06F 3/01* (2006.01)

(52) U.S. Cl.
CPC ....... *H01L 27/3234* (2013.01); *G09G 3/3225* (2013.01); *G09G 2300/0819* (2013.01); *G09G 2300/0847* (2013.01); *G09G 2310/0297* (2013.01)

(58) Field of Classification Search
CPC ... G09G 2300/0852; G09G 2310/0297; G09G 2320/0233; H01L 27/3234; G06F 3/013
See application file for complete search history.

(56) References Cited

U.S. PATENT DOCUMENTS

| | | |
|---|---|---|
| 2005/0174311 A1 | 8/2005 | Huh |
| 2006/0066251 A1* | 3/2006 | Sim ............... G09G 3/3233 315/169.3 |
| 2006/0125741 A1 | 6/2006 | Tanaka |
| 2006/0164359 A1 | 7/2006 | Kimura |
| 2008/0136750 A1 | 6/2008 | Benzarti |
| 2009/0051674 A1 | 2/2009 | Kimura |
| 2009/0167648 A1* | 7/2009 | Jeon ............... G09G 3/3291 345/76 |
| 2009/0245564 A1* | 10/2009 | Mittleman ......... H04M 1/035 381/361 |
| 2009/0251780 A1* | 10/2009 | Adachi ............ G02B 15/1441 359/557 |
| 2010/0302285 A1 | 12/2010 | Yamanaka |
| 2012/0019645 A1* | 1/2012 | Maltz .............. G06F 3/013 348/78 |
| 2013/0057532 A1* | 3/2013 | Lee ................. G09G 3/3225 345/76 |
| 2013/0222440 A1* | 8/2013 | Ikeda .............. H05B 33/08 345/690 |
| 2014/0084805 A1* | 3/2014 | Kim ................. G09G 3/2048 315/240 |
| 2018/0226014 A1* | 8/2018 | Komanduri ........ G02B 6/0051 |
| 2020/0210010 A1* | 7/2020 | Kim ................ G06F 3/0412 |

FOREIGN PATENT DOCUMENTS

| | | |
|---|---|---|
| JP | 2006-184888 A | 7/2006 |
| JP | 2006-227603 A | 8/2006 |
| JP | 2008-532061 A | 8/2008 |
| JP | 2009-015276 A | 1/2009 |
| JP | 2018-045186 A | 3/2018 |
| WO | 2009/098802 A1 | 8/2009 |

* cited by examiner

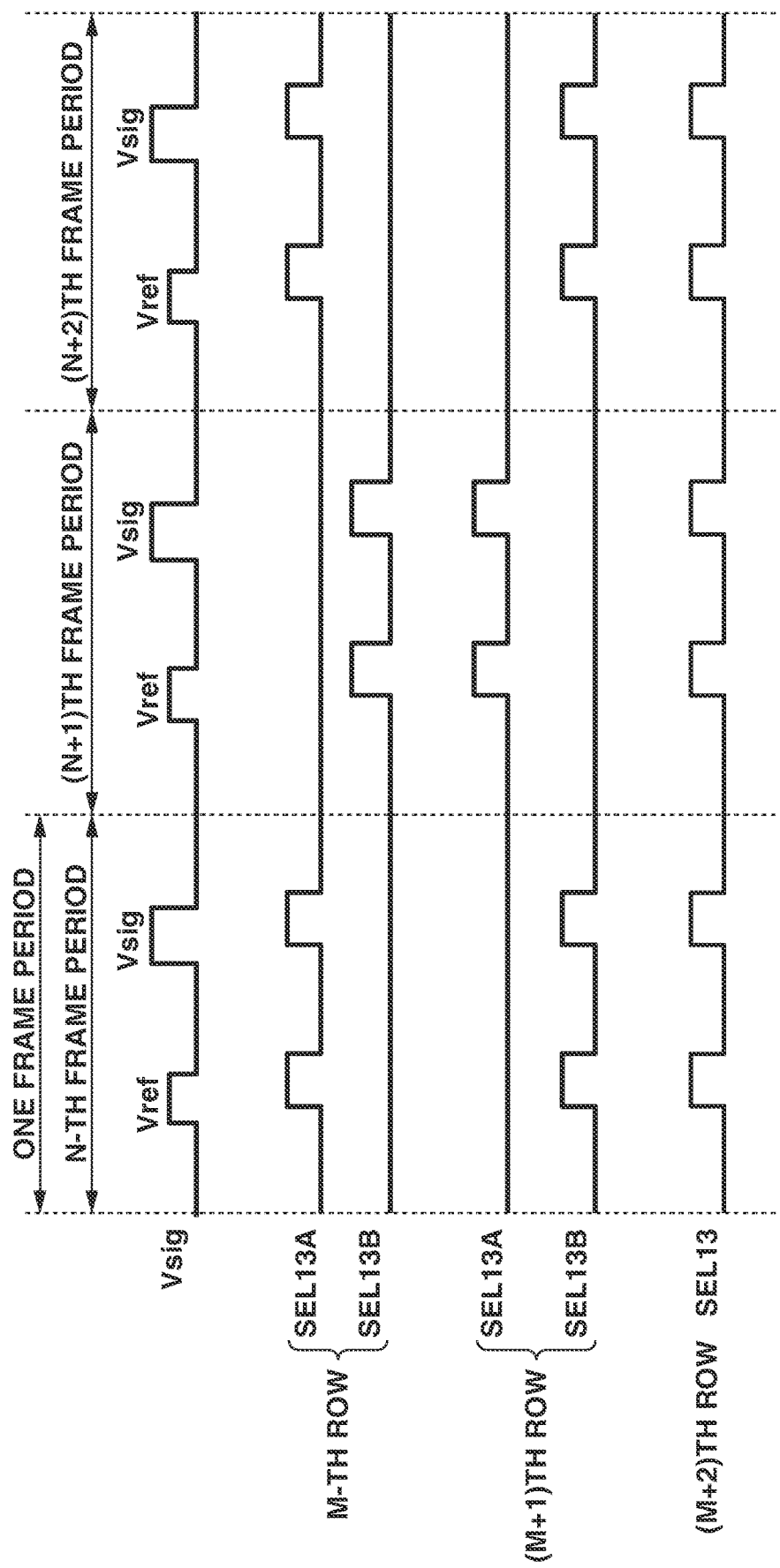

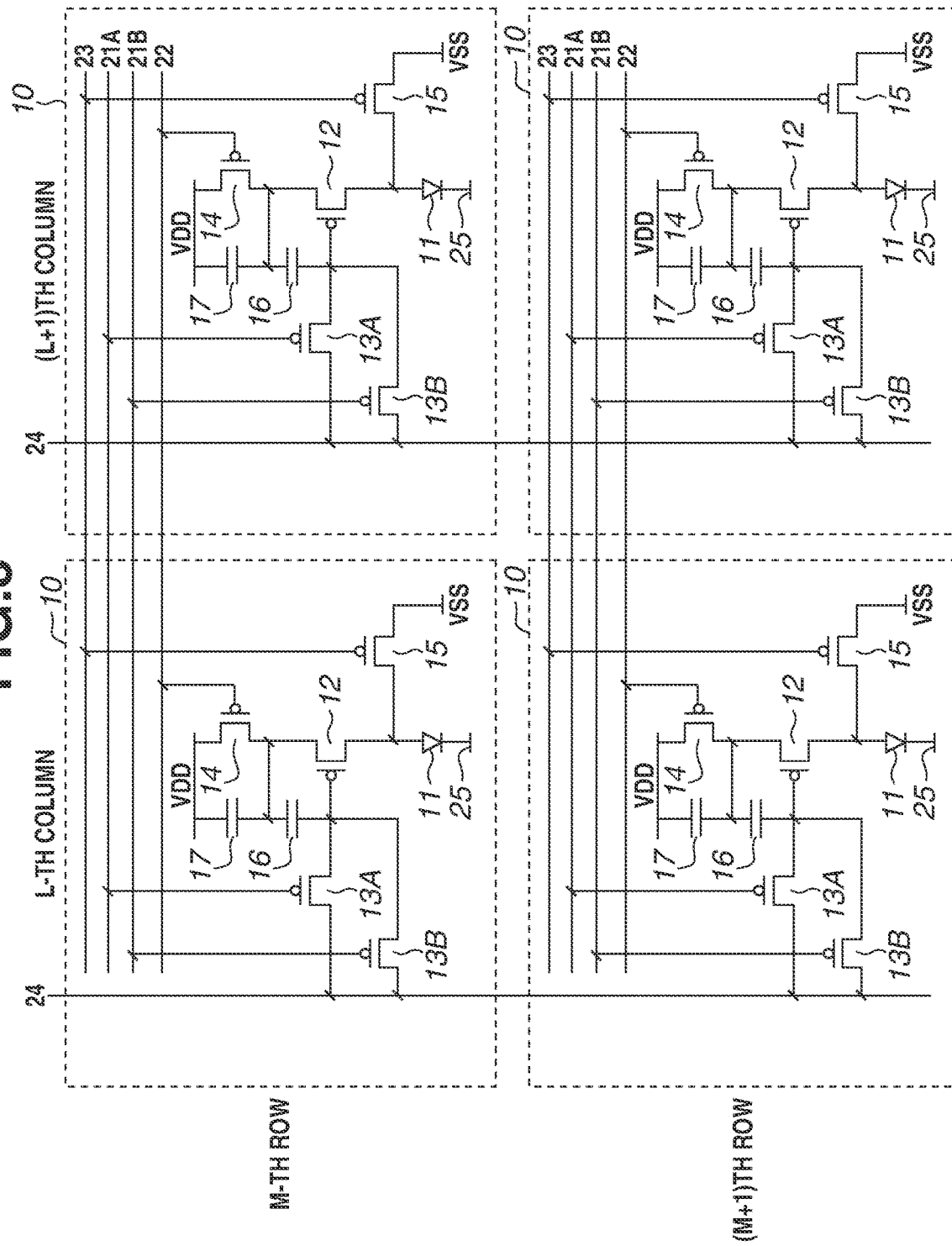

DISPLAY APPARATUS, INFORMATION DISPLAY APPARATUS, PHOTOELECTRIC CONVERSION APPARATUS, ELECTRONIC APPARATUS, LIGHTING APPARATUS, AND MOBILE BODY

BACKGROUND

Technical Field

An aspect of the present disclosure relates to, for example, a display apparatus for improvement in luminance unevenness between pixels, an information display apparatus, a photoelectric conversion apparatus, an electronic apparatus, a lighting apparatus, and a mobile body.

Description of the Related Art

As an example of a display apparatus, there is an active matrix type organic electroluminescence (EL) display apparatus that controls a video signal to be supplied to a display element using a transistor in a pixel.

Japanese Patent Laid-Open No. 2009-15276 discusses a display apparatus having a pixel configuration in which a plurality of signal lines is provided in each column to increase a processing speed.

A conventional example of a pixel circuit will be described with reference to FIG. 15.

In FIG. 15, the signal line 24A is connected to the selection transistor 13 in the pixel circuit in the M-th row (M is an odd number), and the signal line 24B is connected to the selection transistor 13 in the pixel circuit in the (M+1)th row. In other words, the pixels in an odd row are supplied with the signal voltage from the signal line 24A, and the pixels in an even row are supplied with the signal voltage from the signal line 24B.

FIG. 16 is a timing diagram of a conventional example illustrating a driving method using the pixel circuit in FIG. 15. In order to perform threshold correction on the drive transistor in each pixel, the switch circuit of each output terminal in the signal selection circuit 31 is brought into the ON state at the same timing in a state in which the reference voltage (Vref) is supplied as the data signal 32. Accordingly, after the reference voltage Vref is simultaneously written in the signal lines 24A and 24B, the selection transistors 13 in the M-th row and the (M+1)th row are brought into the ON state at the same timing, and the reference voltage is sampled and written in the pixels.

In other words, the reference voltage supplied from the signal line 24A is written in the pixel in the M-th row, and the reference voltage supplied from the signal line 24B is written in the pixel in the (M+1)th row.

Subsequently, the switch circuit in the corresponding signal selection circuit 31 is sequentially brought into the ON state in a state in which the signal voltage (Vsig) (an image signal) is supplied as the data signal 32, and the signal voltage Vsig is written in the signal lines 24A and 24B. Subsequently, the selection transistors 13 in the M-th row and the (M+1)th row are brought into the ON state at the same timing, and the signal voltage is written in the pixels.

In other words, the signal voltage supplied from the signal line 24A is written in the pixel in the M-th row, and the signal voltage supplied from the signal line 24B is written in the pixel in the (M+1)th row. These operations are performed in one horizontal scanning period, and similar circuit operations are repeated in the next and subsequent horizontal scanning periods. The similar circuit operations are performed over all the frame periods.

The signal lines 24A and 24B have different positional relationships with other wiring and transistors, so that wiring capacitances of the signal lines 24A and 24B are also different due to influence of coupling with the other wiring and transistors. Thus, even if the same image signal is applied, there is a possibility that a difference in the signal voltage occurs between the signal lines 24A and 24B. In such a case, a luminance difference is generated by a potential difference occurring between the signal lines. Thus, there is a possibility that the luminance unevenness between pixels occurs due to the signal lines to which the image signal is written.

SUMMARY OF THE INVENTION

According to an aspect, a display apparatus includes a data signal output unit, a first light emitting element, a first transistor, a first capacitive element, a second transistor, and a third transistor. The data signal output unit is connected to the first light emitting element and includes a gate. The first capacitive element includes a first node and a second node. The second transistor is provided on a first input path through which a signal from the data signal output unit is input to the gate. The third transistor is provided on a second input path through which a signal from the data signal output unit is input to the gate and which is different from the first input path. The first node is connected to the second transistor, the third transistor, and the gate. The second node is configured to be supplied with a power source potential.

According to another aspect, a display apparatus includes a plurality of pixels, a plurality of signal lines, and a data signal output unit. Each of the plurality of pixels includes a first light emitting element, a first transistor, a second transistor, and a third transistor. The first transistor is connected to either one of a source and a drain of the first light emitting element. The second transistor is arranged between one of the plurality of signal lines and a gate of the first transistor. The third transistor is arranged between a signal line different from the one of the plurality of signal lines and the gate of the first transistor.

Further features of the disclosure will become apparent from the following description of embodiments with reference to the attached drawings.

BRIEF DESCRIPTION OF THE DRAWINGS

FIG. 7 is an example of a timing diagram illustrating a method for driving a signal selection circuit according to an embodiment.

FIG. 8 is an example of an equivalent circuit diagram of a part of pixels according to an embodiment.

DESCRIPTION OF THE EMBODIMENTS

Figure 1:
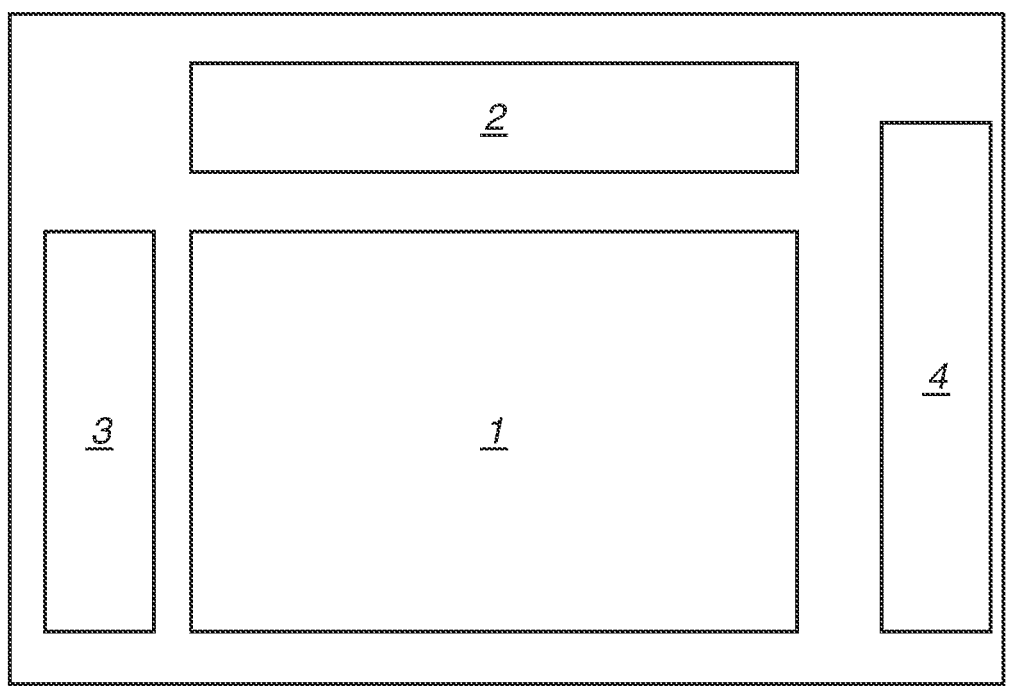
FIG. 1 is a conceptual diagram of a display apparatus according to an embodiment.

The conventional technique has room for improving image quality. For example, an organic electroluminescence (EL) display apparatus may cause luminance unevenness between pixels because a parasitic capacitance of a capacitive element holding a signal differs in each pixel, each column, or each row due to positions of a transistor and wiring in pixels. A configuration discussed in Japanese Patent Laid-Open No. 2009-15276 has room for improvement in luminance unevenness between pixels, such as the occurrence of zigzag display unevenness.

Specific embodiments and application examples of a display apparatus will be described below with reference to the accompanying drawings. In the following description and the drawings, configurations common to a plurality of drawings are denoted by common reference numerals. Therefore, the common configurations are described by mutually referring to the plurality of drawings, and descriptions of the configurations denoted by the common reference numerals are appropriately omitted.

First Embodiment

A display apparatus according to a first embodiment will be described with reference to the accompanying drawings.

Figure 2:
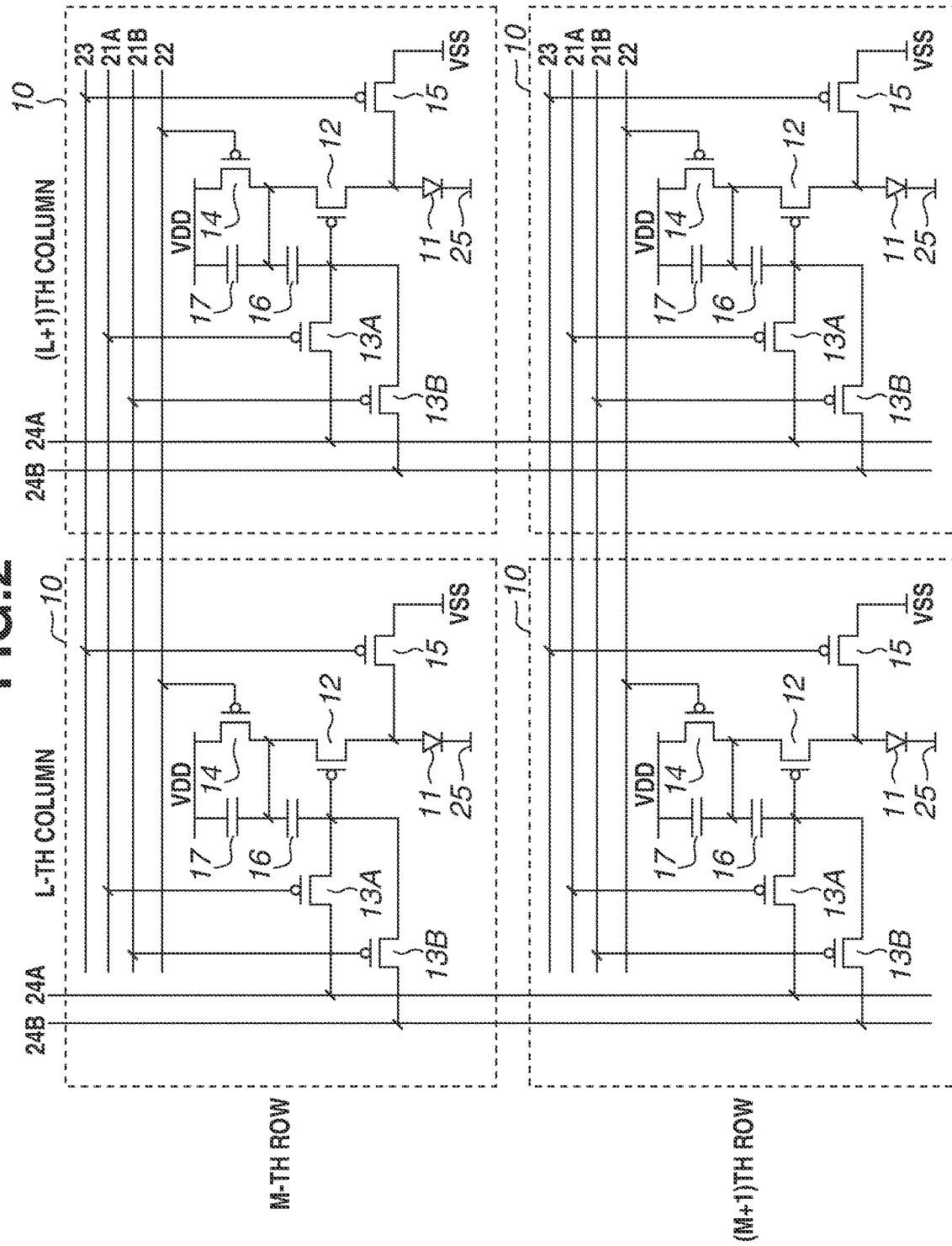
FIG. 2 is an example of an equivalent circuit diagram of a part of pixels according to an embodiment.

FIG. 1 is a schematic view of an example of the display apparatus according to the present embodiment. The display apparatus in FIG. 1 includes a pixel area 1, a horizontal drive circuit 2, a vertical drive circuit 3, and a connection terminal unit 4. In the pixel area 1, a plurality of pixels is arranged in a matrix, and a pixel circuit in FIG. 2 is arranged for each color. Each pixel includes an organic EL element as a light emitting element which emits light of any of red (R), green (G), and blue (B). The horizontal drive circuit 2 is a circuit for outputting a data signal (an image signal and a reference voltage) and is connected to an output line.

Matrix arrangement in the present specification is not limited to arrangement in which light emitting elements and drive circuits of the light emitting elements are arranged in a grid pattern in row and column directions and includes arrangement in which pixels are systematically arranged in a matrix in an entire pixel area. For example, assume that a display apparatus has a configuration in which a light emitting element of an R pixel is arranged in an L-th column (L is a natural number), a light emitting element of a G pixel is arranged in an (L+1)th column, and a light emitting element of a B pixel is arranged in an (L+2)th column. In such a case, the matrix arrangement includes arrangement in which the light emitting elements of the R pixel and the B pixel are aligned in an M-th row, and the light emitting element of the G pixel is arranged between the light emitting element of the R pixel and the light emitting element of the B pixel at a position shifted by a half row from the light emitting elements of the R pixel and the B pixel.

The vertical drive circuit 3 is a circuit for outputting a selection signal. The connection terminal unit 4 is a terminal for inputting a signal, such as a clock signal and a data signal, to the horizontal drive circuit 2 and the vertical drive circuit 3 and is connected to the horizontal drive circuit 2 and the vertical drive circuit 3 by wiring (not illustrated).

The pixel circuit used in the display apparatus according to the present embodiment will be described with reference to FIG. 2. In FIG. 2, a pixel 10 includes a current-driven type light emitting element 11 of which light emission luminance is changed according to a current flowing through an organic EL element and a drive circuit which drives the light emitting element 11. One of electrodes of the light emitting element 11 is connected to a common power source 25 which is commonly wired to all of the pixels 10. An example is described here in which a cathode electrode of the light emitting element 11 is connected to the common power source 25.

The drive circuit for driving the light emitting element 11 includes a drive transistor 12, selection transistors 13A and 13B, switching transistors 14 and 15, a first capacitive element 16, and a second capacitive element 17. In the example described here, P-channel type transistors are used as the drive transistor 12, the selection transistors 13, and the switching transistors 14 and 15.

In the present specification, a suffix is appended after the reference numeral, such as that of the selection transistor 13A in a case where a specific selection transistor is described in a plurality of the selection transistors 13A and 13B. If either or both of the selection transistors are referred to, it is simply referred to as the selection transistor 13. The same applies to other components.

The drive transistor 12 is connected to the light emitting element 11 in series and thus supplies the light emitting element 11 with a driving current. More specifically, a drain electrode of the drive transistor 12 is connected to an anode electrode of the light emitting element 11. A light emitting amount of the light emitting element 11 is controlled according to a voltage value of a signal input to a gate electrode of the drive transistor 12.

The selection transistor 13A is connected to a scanning line 21A via a gate electrode, to a signal line 24A via a source electrode, and to the gate electrode of the drive transistor 12 via a drain electrode. The selection transistor 13B is connected to the scanning line 21B via a gate electrode, to a signal line 24B via a source electrode, and to the gate electrode of the drive transistor 12 via a drain electrode. In other words, a single pixel 10 includes two selection transistors 13, so that there are two input paths through which a signal from the horizontal drive circuit 2 as a data signal output unit is input to the pixel 10.

A signal written from the vertical drive circuit 3 through a scanning line 21A is applied to the gate electrode of the selection transistor 13A. A signal written from the vertical drive circuit 3 through a scanning line 21B is applied to the gate electrode of the selection transistor 13B. The signals written via the scanning lines 21A and 21B control ON and OFF of the selection transistors 13A and 13B, respectively.

In a case where the selection transistor 13A is turned ON, the input path between the signal line 24A and the gate electrode of the drive transistor 12 becomes conductive. In a case where the selection transistor 13A is turned OFF, the input path between the signal line 24A and the gate electrode of the drive transistor 12 is electrically interrupted. The same applies to the signal line 24B and the selection transistor 13B.

The display apparatus according to the present embodiment includes the horizontal drive circuit 2 as the data signal output unit, the light emitting element 11, and a first input path and a second input path through which a signal from the data signal output unit is input to the light emitting element 11. The second input path is different from the first input path. For example, in FIG. 2, regarding the light emitting element included in the pixel in the L-th column and the M-th row, the first input path includes the signal line 24A and the selection transistor 13A, and the second input path includes the signal line 24B and the selection transistor 13B.

The switching transistor 14 is connected to a scanning line 22 via a gate electrode, to a first power source potential VDD via a source electrode, and to a source electrode of the drive transistor 12 via a drain electrode. The gate electrode of the switching transistor 14 is applied with a signal for controlling light emission from the vertical drive circuit 3 through the scanning line 22.

The switching transistor 15 is connected to a scanning line 23 via a gate electrode, to a second power source potential VSS via a source electrode, and to the anode electrode of the light emitting element 11 via a drain electrode. The gate electrode of the switching transistor 15 is applied with a signal for controlling the potential of the anode electrode of the light emitting element from the vertical drive circuit 3 through the scanning line 23.

The first capacitive element 16 is connected between the gate electrode and the source electrode of the drive transistor 12. The second capacitive element 17 is connected between the source electrode of the drive transistor 12 and the first power source potential VDD.

The vertical drive circuit 3 connected to the scanning lines 21A, 21B, 22, and 23 sequentially supplies signals, row by row, to cause a holding capacitive element in each pixel to hold a signal voltage and a reference voltage and to control the pixel to emit light with luminance corresponding to the signal voltage.

The pixel circuits in the M-th row and in an (M+1)th row have the same circuit configuration, and the pixel circuits in the L-th column and in the (L+1)th column have the same circuit configuration.

In the pixel 10 including the above-described configuration, the selection transistors 13A and 13B are brought into a conductive state in response to a writing signal applied to the gate electrodes from the vertical drive circuit 3 through the scanning lines 21A and 21B. Through this operation, the signal voltage or the reference voltage corresponding to luminance information is sampled and written in the pixel 10. A threshold voltage variation of the drive transistor 12 in each pixel is corrected by being applied with the reference voltage, and thus a luminance variation in each pixel due to the threshold voltage variation can be reduced. The written signal voltage or the written reference voltage is applied to the gate electrode of the drive transistor 12 and also held by the first capacitive element 16.

The drive transistor 12 is designed to operate in a saturation region. The drive transistor 12 receives supply of a current from the first power source potential VDD via the switching transistor 14 and causes the light emitting element 11 to emit light by current drive. At this time, an amount of the current flowing through the light emitting element 11 is determined according to the voltage held by the first capacitive element 16, so that the light emitting amount of the light emitting element 11 can be controlled. A signal for controlling light emission is applied to the gate electrode of the switching transistor 14 from the vertical drive circuit 3 through the scanning line 22, and thus the switching transistor 14 is brought into the conductive state. In other words, the switching transistor 14 has the function of controlling light emission and non-light emission of the light emitting element 11.

A signal for controlling the potential of the anode electrode of the light emitting element 11 is applied to the gate electrode of the switching transistor 15 from the vertical drive circuit 3 through the scanning line 23, and thus the switching transistor 15 selectively supplies the second power source potential VSS to the anode electrode. If a potential of the common power source 25 connected to the cathode electrode of the light emitting element 11 is denoted as a cathode electrode potential Vcath, and a threshold voltage of the light emitting element 11 is denoted as a threshold voltage Vthel, the second power source potential VSS is designed to satisfy a condition VSS<Vcath+Vthel. Accordingly, in a case where the switching transistor 15 is in the conductive state, the light emitting element 11 can be controlled to be in a non-light emission state by being applied with reverse bias.

In FIG. 2, a P-channel metal oxide semiconductor (PMOS) transistor is used as a MOS transistor, but an N-channel MOS (NMOS) transistor may be used. FIG. 2 illustrates the circuit configuration including five transistors and two capacitive elements, 5Tr2C, as the drive circuit of the light emitting element 11, but the drive circuit is not limited to this circuit configuration. For the MOS transistor, a transistor formed on a silicon wafer or a thin-film transistor formed on a glass substrate may be used.

A configuration of an interface for transmitting a data signal to the signal line 24 will be described with reference to FIG. 3. A signal selection circuit 31 is arranged, positioned, or disposed between the horizontal drive circuit 2 and the signal line 24 in the display apparatus. The signal selection circuit 31 is capable of selectively outputting a data signal 32 to the signal line 24 connected to an output terminal and is provided with a switch circuit on each output terminal. If the number of the signal lines 24 output from one signal selection circuit 31 is denoted as M, and the number of the signal selection circuits 31 is denoted as N, the total number of the signal lines 24 is expressed as M*N.

Figure 3:
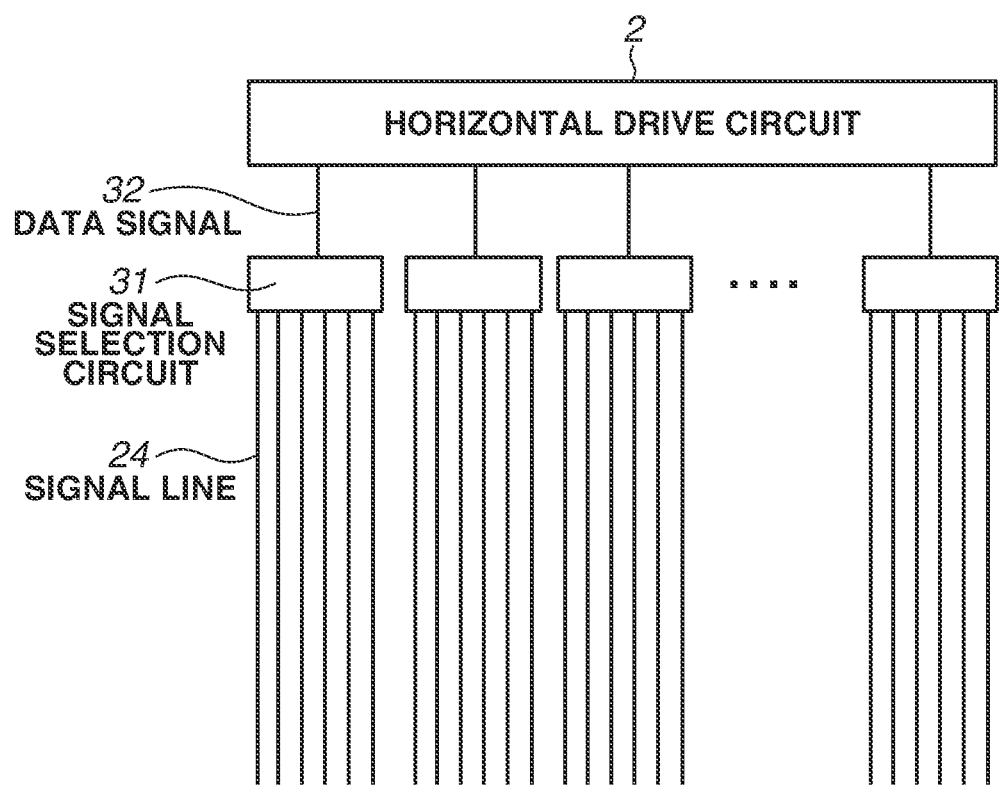
FIG. 3 is a diagram of an interface of the display apparatus according to an embodiment.

FIG. 3 illustrates an example of a configuration in which six signal lines 24 can be output from one signal selection circuit 31, so that the one signal selection circuit 31 is provided with six switch circuits. In such a case, a writing operation of the signal voltage is performed six times using the switch circuits in one horizontal scanning period. The signal lines 24A and 24B may be connected to the same signal selection circuit 31 or to respectively different signal selection circuits 31.

The signal line 24 has a wiring capacitance and thus is brought into a floating state and holds the signal voltage in a period in which the writing operation is not performed by the switch circuit provided on the signal selection circuit 31. The signal line 24 can hold the supplied signal voltage until the selection transistors 13 are simultaneously brought into an ON state for each selected row, and the signal voltage is written in the pixel circuit.

One column is provided with a plurality of signal lines 24, and thus different signals can be simultaneously supplied in units of a plurality of rows. Accordingly, a time for writing in each pixel in one frame can be reduced, and a frame rate for displaying an image can be improved.

Even in a case where the plurality of signal lines is not connected to the same signal selection circuit 31, a time for writing in each pixel in one frame can be reduced, and the frame rate can be improved. The reason is as follows. In a case where one column is provided with one signal line, a signal for a next row cannot be supplied to the column until the potential of the signal line is stabilized after the signal is supplied to the signal line. On the other hand, since one column is provided with the plurality of signal lines, a signal can be supplied from another signal line to a pixel in another row in the same column while the potential of the signal supplied from one signal line is stabilized.

Figure 4:
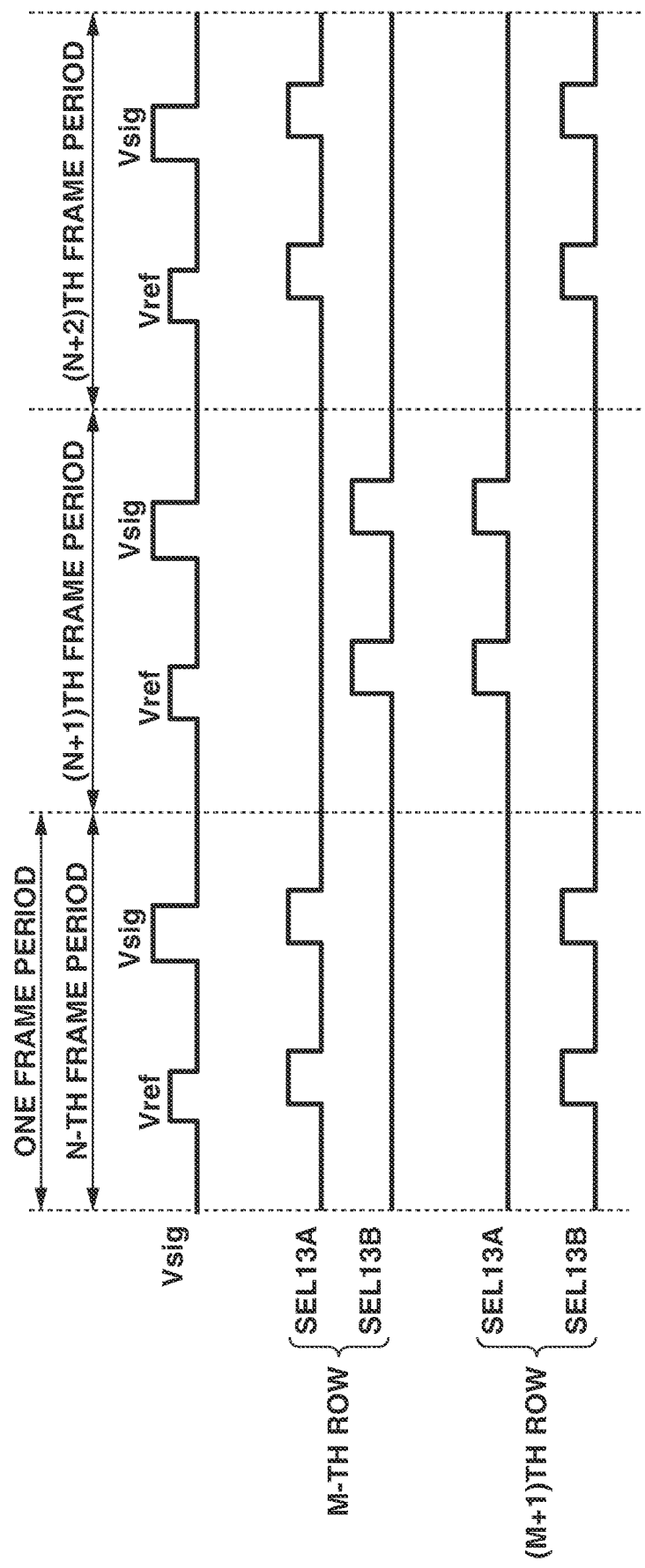
FIG. 4 is an example of a timing diagram illustrating a method for driving a signal selection circuit according to an embodiment.

A timing diagram illustrating a driving method using the pixel circuit in FIG. 2 according to the present embodiment will be described with reference to FIG. 4.

In order to perform threshold correction on the drive transistor in each pixel in an N-th frame period, the switch circuit of each output terminal in the signal selection circuit 31 is brought into the ON state at the same timing in a state in which the reference voltage (Vref) is supplied as the data signal 32.

After the reference voltage Vref is simultaneously written in the signal lines 24A and 24B, the selection transistor 13A in the M-th row is brought into the ON state while the selection transistor 13B in the M-th row is maintained in an OFF state, and thus the reference voltage is sampled and written in the pixel in the M-th row.

Similarly, the selection transistor 13B in the (M+1)th row is brought into the ON state while the selection transistor 13A in the (M+1)th row is maintained in the OFF state, and thus the reference voltage is sampled and written in the pixel in the (M+1)th row. In other words, the reference voltage supplied from the signal line 24A is written in the pixel in the M-th row, and the reference voltage supplied from the signal line 24B is written in the pixel in the (M+1)th row.

Subsequently, the switch circuits in the corresponding signal selection circuit 31 are sequentially brought into the ON state in a state in which a signal voltage (Vsig) (an image signal) is supplied as the data signal 32, and thus the signal voltage Vsig is written in the signal lines 24A and 24B. Subsequently, the selection transistor 13A in the M-th row is brought into the ON state while the selection transistor 13B in the M-th row is maintained in the OFF state, and thus the signal voltage is written in the pixel in the M-th row at a certain time. Next, the selection transistor 13B in the (M+1)th row is brought into the ON state while the selection transistor 13A in the (M+1)th row is maintained in the OFF state, and thus the signal voltage is written in the pixel in the (M+1)th row.

In other words, for the pixels in the M-th row, the signal voltage from the data signal output unit is written in the pixel through the input path including the signal line 24A and the selection transistor 13A in a state in which the input path including the signal line 24B and the selection transistor 13B are electrically interrupted. For the pixels in the (M+1)th row, the signal voltage from the data signal output unit is written in the pixel through the input path including the signal line 24B and the selection transistor 13B in a state in which the input path including the signal line 24A and the selection transistor 13A are electrically interrupted.

These operations are simultaneously performed in the M-th row and the (M+1)th row in one horizontal scanning period, and the similar circuit operations are repeated in two rows at the same time in the horizontal scanning period in the (M+2)th and subsequent rows.

In a case where the selection transistor 13A is changed into the ON state, and the signal voltage is written in the pixel, the signal line 24A is in the floating state. Similarly, in a case where the selection transistor 13B is changed into the ON state, and the signal voltage is written in the pixel, the signal line 24B is in the floating state.

In an (N+1)th frame period, the reference voltage and the signal voltage are written in the pixel through a path different from that in the N-th frame period. In other words, the reference voltage supplied from the signal line 24B is written in the pixel in the M-th row, and the reference voltage supplied from the signal line 24A is written in the pixel in the (M+1)th row.

For the pixels in the M-th row, the signal voltage from the data signal output unit is written in the pixel through the input path including the signal line 24B and the selection transistor 13B in the state in which the input path including the signal line 24A and the selection transistor 13A are electrically interrupted. For the pixels in the (M+1)th row, the signal voltage from the data signal output unit is written in the pixel through the input path including the signal line 24A and the selection transistor 13A in the state in which the input path including the signal line 24B and the selection transistor 13B are electrically interrupted. In an (N+2)th frame period, the reference voltage and the signal voltage are written in the pixel through the same path as that in the N-th frame period.

According to the present embodiment, the input path through which the signal from the data signal output unit is written in the pixel is different for each frame period.

The input path is changed for each frame period, so that a luminance difference between pixels due to a difference in a parasitic capacitance of the capacitive element is averaged for each plurality of frames. Thus, the luminance difference is averaged on a time axis, and display unevenness can be reduced or prevented in an entire display panel. In addition, even in a case where the parasitic capacitance is different for each signal line, the luminance difference between pixels is averaged for each plurality of frames.

In the present specification, the frame period refers to a time period from a timing at which an initialization voltage Vref is written in a certain signal line in a certain pixel in an optional row to a timing at which the initialization voltage Vref is written next in the certain pixel in the row.

If the writing of a data signal is performed for, for example, each row or for each plurality of rows, in terms of pixels in an optional column, next writing may not be performed on the pixel in the same row after final writing along a direction in which the writing proceeds. In such a case, the frame period refers to a time period from a timing A at which the initialization voltage Vref is written in the pixel in the optional column to a timing B. The timing B is a timing at which the initialization voltage Vref is written in another row and which comes after and is closest to a timing at which the initialization voltage Vref is to be written in the pixel next if writing is sequentially performed on the pixels in all rows.

Figure 15:
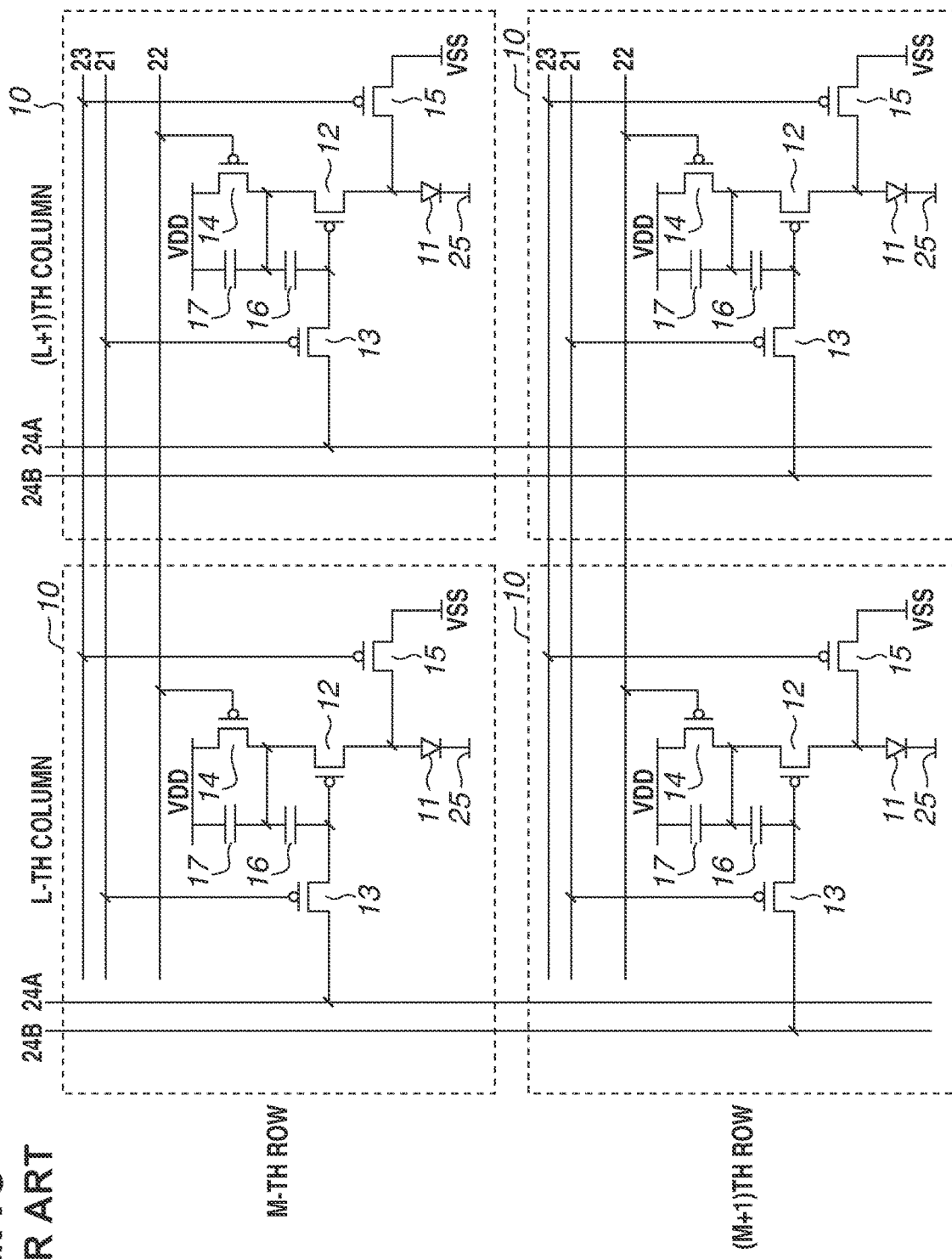
FIG. 15 is an example of an equivalent circuit diagram of a part of conventional pixels.
Figure 16:
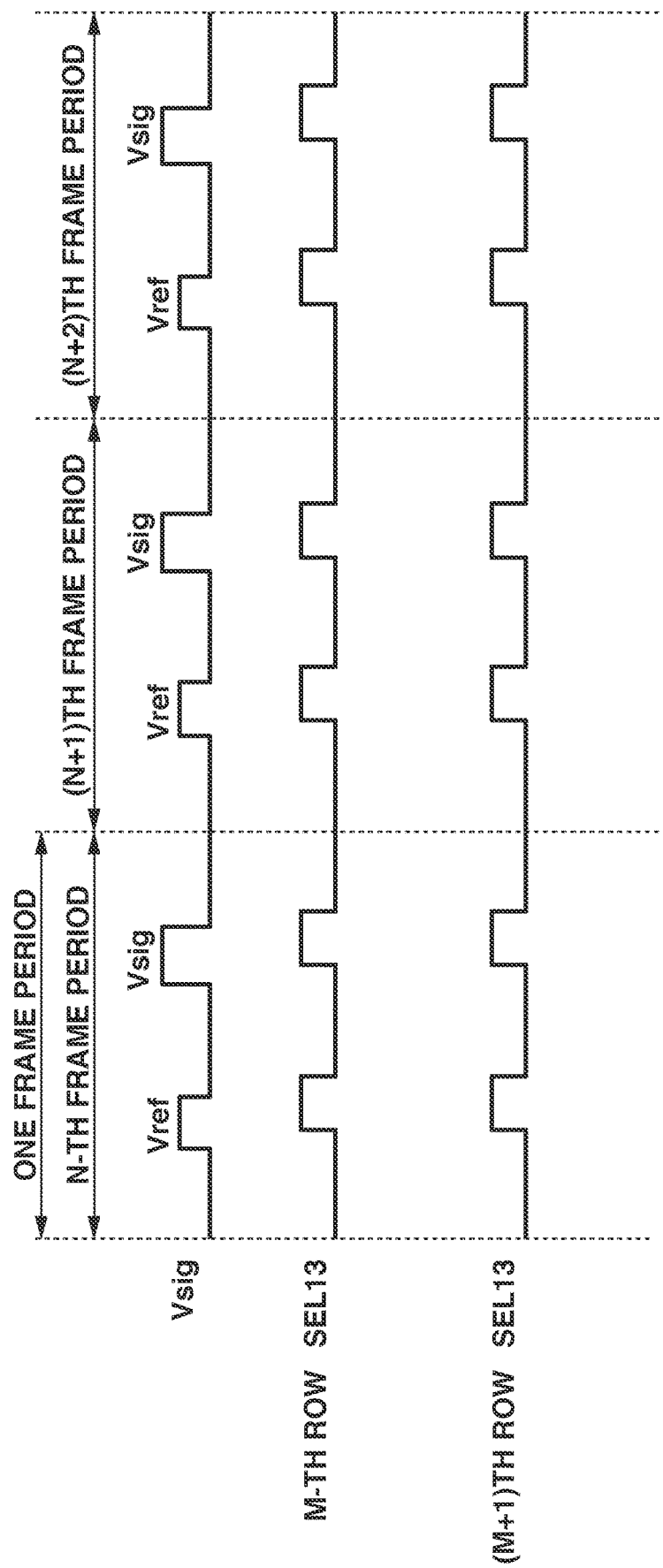
FIG. 16 illustrates an example of a method for driving a conventional signal selection circuit.

As discussed in the related art section, in the conventional techniques shown in FIGS. 15 and 16, there is a possibility that the luminance unevenness between pixels occurs due to the signal lines to which the image signal is written. By contrast, the display apparatus according to the embodiment switches the input path from the data signal output unit to the light emitting element 11 in one pixel in a first frame period and a second frame period which is different from the first frame period. Thus, if a luminance difference is generated between pixels due to a difference in the parasitic capacitances of the signal lines 24A and 24B and the like, a relationship of the luminance difference between pixels due to the difference in the parasitic capacitances is opposite in the first frame period and the second frame period. Thus, the luminance difference between pixels is reduced by being averaged over time. Accordingly, this realizes the display apparatus that reduces a luminance difference between pixels. The conventional example shown in FIG. 15 is different from the pixel circuit according to the present embodiment in that the pixel circuit includes a single selection transistor 13 for a single light emitting element 11, and thus includes one input path through which a signal from the data signal output unit is input to the light emitting element 11.

According to the present embodiment, the input path of a signal is differentiated between an odd frame period and an even frame period, but this is not restrictive. Any configuration that includes a pixel in which the signal line for supplying an image signal is changed for each frame period is applicable. For example, the pixel circuit may be driven so that a signal from the data signal output unit is input to a pixel through an input path different from that in another frame period only in a specific frame period. The pixel circuit may be driven so that a signal from the data signal output unit is input to the pixel through an input path different for each frame period only in a specific row.

According to the present embodiment, an example is described which includes two paths through which a signal from the data signal output unit is written in a pixel (a light emitting element). However, the present embodiment is not limited to this example as long as a plurality of different paths is provided. For example, a configuration may be adopted in which each column is provided with three or more signal lines, and each pixel is provided with three or more selection transistors.

The above description "a signal from the data signal output unit is input to a pixel (the light emitting element 11)" includes not only a case in which a voltage corresponding to the signal is actually input to the light emitting element 11 but also a case in which the signal is input to the gate of the drive transistor 12 to be applied to the light emitting element 11.

According to the present embodiment, the case is described in which the data signal output unit is the horizontal drive circuit 2 arranged in the display apparatus. However, the data signal output unit is not limited to this configuration. For example, in a case where the horizontal drive circuit 2 is arranged on the outside of the display apparatus and a signal (a signal voltage) is supplied via a pad, the data signal output unit may be the pad.

Since a parasitic capacitance of the first capacitive element 16 is changed by changing a layout of the scanning lines for each selection transistor, this change can be used to reduce a signal voltage difference which generates in each pixel. For example, the parasitic capacitance of the first capacitive element 16 varies due to a layout position of the scanning lines of the selection transistor 13. The input path of a signal from the data signal output unit to the pixel can be changed by ON/OFF of each selection transistor 13, so that the signal voltage to be written in the first capacitive element 16 can be changed to reduce a difference in the parasitic capacitance of the first capacitive element 16.

In other words, the luminance difference between pixels can be further reduced by reduction of the signal voltage difference due to the wiring layout in addition to the driving method according to the present embodiment.

Second Embodiment

Figure 5:
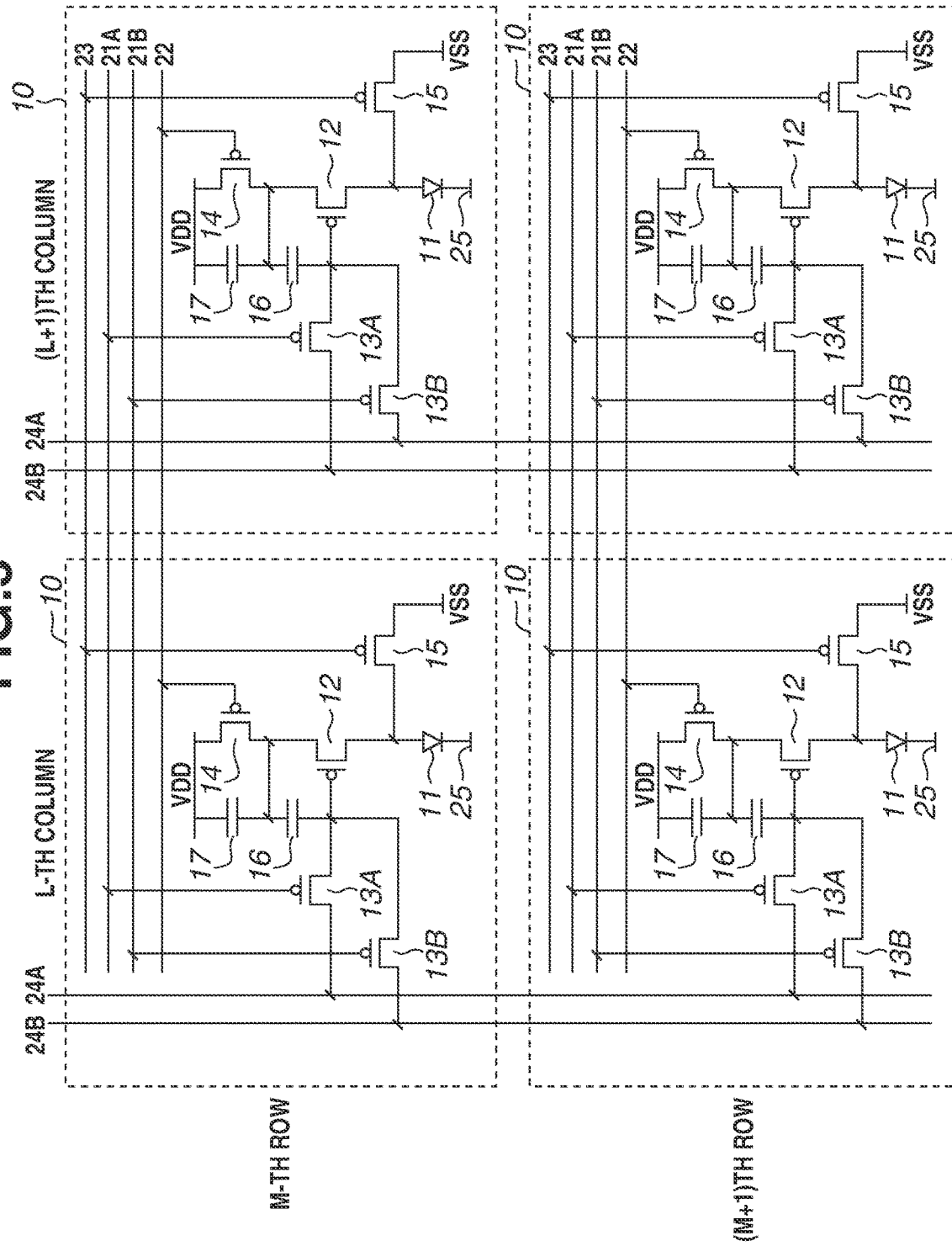
FIG. 5 is an example of an equivalent circuit diagram of a part of pixels according to an embodiment.

FIG. 5 illustrates a pixel circuit according to a second embodiment. The present embodiment is different from the first embodiment in that a certain row in one frame period includes pixels having different signal lines for supplying image signals. In other words, a certain row in an optional frame includes a pixel connected to the signal line 24A and a pixel connected to the signal line 24B as the signal line 24 for supplying a signal voltage (an image signal).

In pixels in the M-th row of the L-th column and in the (M+1)th row of the L-th column, the signal line 24A is connected to a source electrode of the selection transistor 13A, and the signal line 24B is connected to a source electrode of the selection transistor 13B. In pixels in the M-th row of the (L+1)th column and in the (M+1)th row of the (L+1)th column, the signal line 24B is connected to the source electrode of the selection transistor 13A, and the signal line 24A is connected to the source electrode of the selection transistor 13B.

A plane view is omitted, but the signal lines 24A and 24B in the (L+1)th column respectively correspond to the signal lines 24A and 24B in the L-th column. Thus, the signal lines 24A and 24B in the (L+1)th column are respectively parallel to the signal lines 24A and 24B in the L-th column. If the parasitic capacitance of the signal line 24A is larger than that of the signal line 24B in the L-th column, the parasitic capacitance of the signal line 24A is also larger than that of the signal line 24B in the (L+1)th column.

Pixels with different signal lines for supplying image signals coexist in the same row in such a manner, so that linear luminance unevenness generating between rows is averaged for each plurality of columns, and display unevenness can be controlled.

According to the present embodiment, the configuration has been described in which the signal lines for supplying an image signal are changed between an odd column and an even column. However, the configuration is not limited to the above-described one as long as display unevenness can be controlled. For example, the signal line for supplying a signal to the pixel may be changed for each plurality of columns according to characteristics of each pixel and convenience of the wiring layout. In order to make display unevenness less noticeable, the column for which the signal line for supplying a signal to the pixels is changed may be randomly arranged.

Third Embodiment

Figure 6:
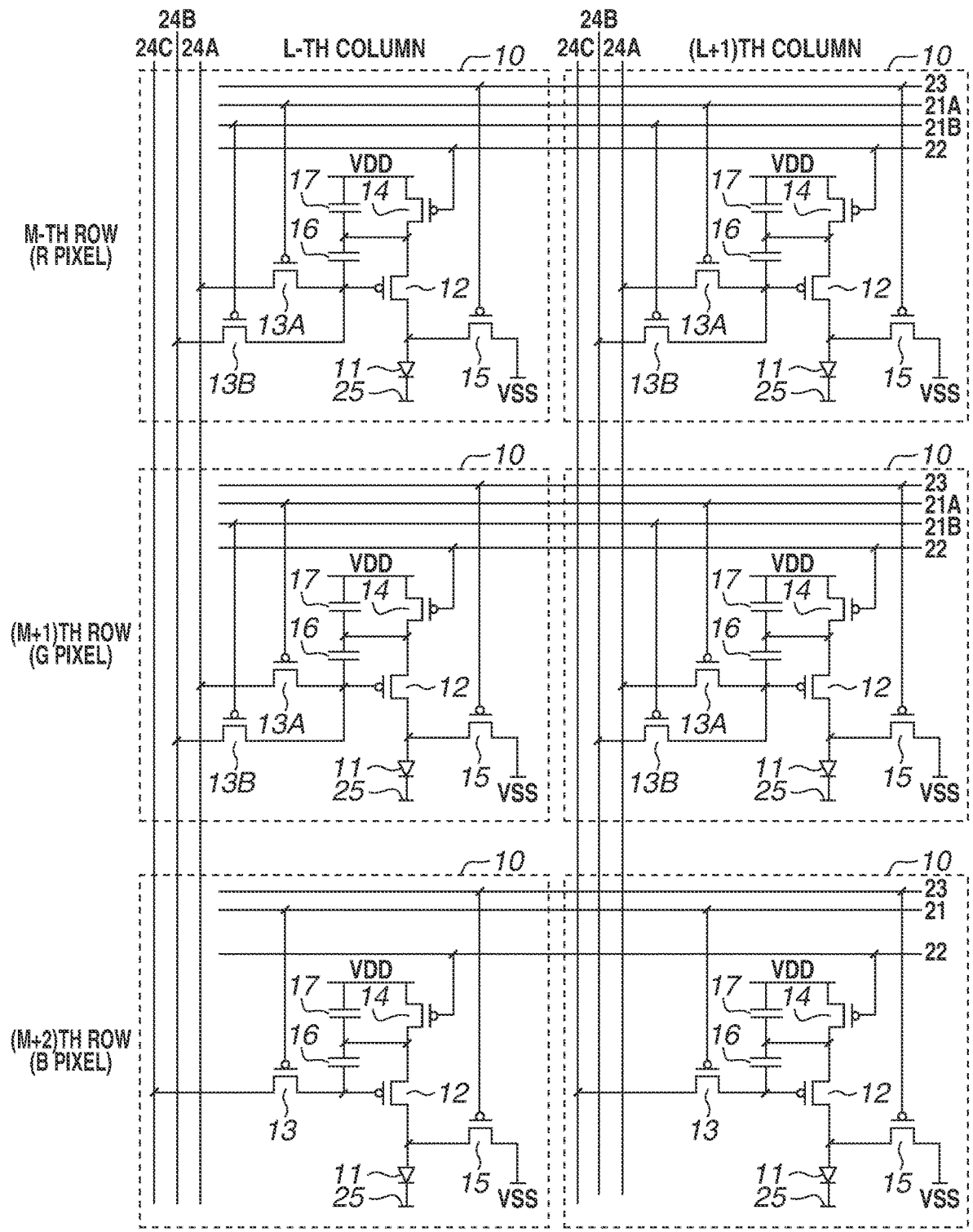
FIG. 6 is an example of an equivalent circuit diagram of a part of pixels according to an embodiment.

FIG. 6 illustrates a pixel circuit according to a third embodiment.

The present embodiment is different from the first embodiment in that only the pixels of a specific color have a different path through which a data signal is written in a pixel (a light emitting element) for each frame period.

A red (R) pixel, a green (G) pixel, and a blue (B) pixel are respectively arranged in stripes in the M-th row, the (M+1)th row, and the (M+2)th row, and the red, green, and blue pixels are periodically arranged every three rows. In the red (R) and green (G) pixels in the M-th row and the (M+1)th row, the signal line 24A is connected to the source electrodes of the selection transistors 13A, and the signal line 24B is connected to the source electrodes of the selection transistors 13B. By contrast, in the blue (B) pixel in the (M+2)th row, only one selection transistor 13 is arranged, and a signal line 24C is connected to the source electrode of the selection transistor 13.

In other words, according to the present embodiment, the light emitting element 11 in a part of a plurality of pixels includes a plurality of paths through which a signal output from the data signal output unit is input, and the light emitting element 11 in the other parts of the plurality of pixels includes one path through which a signal output from the data signal output unit is input. The color of emitting light is different between the pixel including two input paths and the pixel including one input path.

A timing diagram illustrating a driving method using the pixel circuit in FIG. 6 according to the present embodiment will be described with reference to FIG. 7. The present embodiment is different from the first embodiment in that the reference voltage and the signal voltage are always written in the pixels using the selection transistor 13 only in the (M+2)th row for driving the blue (B) pixel. The writing operations are simultaneously performed in the M-th row, the (M+1)th row, and the (M+2)th row in one horizontal scanning period, and similar circuit operations are simultaneously performed in three rows in the horizontal scanning period of an (M+3)th row and subsequent rows.

As described above, the signal line (the input path) for supplying an image signal is changed for each frame period with preference given to the red (R) and green (G) pixels which have high visibility and in which the luminance difference is easily noticeable, which also achieves an effect of controlling display unevenness. The selection transistor of the blue (B) pixel is arranged only one in each pixel, so that a degree of freedom in the layout of the pixel is improved, and resolution can be improved while the pixel is miniaturized.

Fourth Embodiment

A fourth embodiment will be described below. FIG. 8 illustrates a pixel circuit according to a fourth embodiment.

The present embodiment is different from the first embodiment in that one signal line is arranged for each column. The source electrodes of the selection transistors 13A and 13B in each pixel are connected to the same signal line 24.

A plurality of the selection transistors is provided in each pixel even if there is a single signal line in each column, so that a plurality of input paths can be provided through which a signal from the data signal output unit is input to the light emitting element 11.

Due to the layout of the pixels, the layout of the transistors other than the selection transistors and wiring may be different between pixels, and the parasitic capacitance of the first capacitive element 16 for holding a signal may be different between pixels. By contrast, the display apparatus according to the present embodiment includes two input paths to the pixel (the light emitting element). Since the input path is different, the signal voltage to be written in the first capacitive element 16 can be changed using a difference of the parasitic capacitance due to a layout position of the scanning line of the selection transistor and the like. Thus, the luminance difference between pixels can be reduced by selecting the input path to reduce the difference of the parasitic capacitance of the first capacitive element 16.

Further, the selection transistor in which a signal is written is changed for each frame period in the display apparatus according to the present embodiment, and thus the luminance difference between pixels can be averaged for each plurality of frames. Accordingly, the luminance difference is averaged on the time axis, and display unevenness can be controlled in the entire display panel.

Fifth Embodiment

[Configuration of Organic Light Emitting Element]

An organic light emitting element is provided by forming an anode, an organic compound layer, and a cathode on a substrate. A protective layer, a color filter, and the like may be provided on the cathode. In a case where the color filter is provided, a planarization layer may be provided between the protective layer and the color filter. The planarization layer can be made of an acrylic resin and the like.

[Substrate]

The substrate may include quartz, glass, a silicon wafer, resin, and a metal. A switching element, such as a transistor, and wiring may be provided on the substrate, and an insulating layer may be provided thereon. The insulating layer may be made of any material as long as a contact hole can be formed thereon to secure continuity between the anode and the wiring, and insulation can be secured from the wiring not connected. For example, a polyimide resin, silicon oxide, silicon nitride, and the like can be used for the insulating layer.

[Electrode]

A pair of electrodes may be used as electrodes. The pair of electrodes may be the anode and the cathode. In a case where an electric field is applied in the direction in which the organic light emitting element emits light, the electrode having a higher potential is the anode, and the other is the cathode. It can also be said that the electrode that supplies a hole to a light emitting layer is the anode, and the electrode that supplies an electron is the cathode.

A component material having a work function as large as possible is suitable for the anode. For example, an elemental metal substance, such as gold, platinum, silver, copper, nickel, palladium, cobalt, selenium, vanadium, and tungsten, and a mixture including these substances may be used for the anode. Alternatively, an alloy obtained by combining these substances may be used for the anode. For example, a metal oxide, such as stannic oxide, zinc oxide, indium oxide, indium tin oxide (ITO), and indium zinc oxide can be used. In addition, a conductive polymer, such as polyaniline, polypyrrole, and polythiophene can be used.

These electrode substances may be used standalone or in a combination of two or more substances. The anode may include a single layer or a plurality of layers.

In a case where the electrode is used as a reflection electrode, for example, chromium, aluminum, silver, titanium, tungsten, molybdenum, an alloy thereof, or a lamination layer thereof can be used. In a case where the electrode is used as a transparent electrode, an oxide transparent conductive layer made of, for example, indium tin oxide (ITO), and indium zinc oxide can be used but the transparent electrode is not limited thereto. A photolithography technique can be used for forming the electrode.

For the cathode, a component material having a small work function is suitable. For example, an alkali metal, such as lithium, an alkali earth metal, such as calcium, an elemental metal, such as aluminum, titanium, manganese, silver, lead, and chromium, and a mixture including these substances may be used. Alternatively, an alloy obtained by combining these elemental metals can be used. For example, alloys of magnesium-silver, aluminum-lithium, aluminum-magnesium, silver-copper, zinc-silver, and the like can be used. A metal oxide, such as indium tin oxide (ITO) can also be used. The above-described electrode substances may be used standalone or in a combination of two or more substances. In addition, the cathode may have a single layer structure or a multilayer structure. In particular, silver may be used, and a silver alloy may be used in order to control aggregation of silver. An alloy ratio does not matter as long as aggregation of silver can be controlled. For example, the alloy ratio may be one to one.

The cathode is not particularly limited and may be formed as a top emission element with an oxide conductive layer of ITO or the like and may be formed as a bottom emission element with a reflection electrode of aluminum (Al) or the like. A method for forming the cathode is not particularly limited. However, if direct current (DC) sputtering and alternating current (AC) sputtering is used, film coverage is good, and resistance can be easily reduced.

[Protective Layer]

The protective layer may be provided on the cathode. For example, glass provided with a moisture absorbent is bonded on the cathode, and thus infiltration of water and the like into the organic compound layer can be reduced or prevented, and the occurrence of display defect can be controlled. As another embodiment, a passivation film made of silicon nitride and the like may be provided on the cathode to reduce or prevent infiltration of water and the like into an organic EL layer. For example, after forming the cathode, the cathode may be conveyed to another chamber without breaking the vacuum, and a silicon nitride film having a thickness of 2 µm may be formed thereon as the protective layer through a chemical vapor deposition (CVD) method. The protective layer may be provided through an atomic layer deposition (ALD) method after the firm formation through the CVD method.

[Color Filter]

The color filter may be provided on the protective layer. For example, another substrate provided with the color filter that takes into consideration a size of the organic light emitting element may be bonded to the substrate provided with the organic light emitting element, or the color filter may be patterned on the above-described protective layer through the photolithography technique. The color filter may be made of a polymer.

[Planarization Layer]

The planarization layer may be included between the color filter and the protective layer. The planarization layer may be made of an organic compound. The organic compound may be a low-molecular or macromolecular compound and, in particular, may be a macromolecular compound.

The planarization layers may be provided above and below the color filter and may be made of the same or different component materials. More specifically, polyvinylcarbazole resin, polycarbonate resin, polyester resin, acrylonitrile-butadiene-styrene (ABS) resin, acrylic resin, polyimide resin, phenol resin, epoxy resin, silicon resin, urea resin and the like may be used.

[Counter Substrate]

A counter substrate may be provided on the planarization layer. The counter substrate is provided on a position facing the above-described substrate and thus is referred to as a counter substrate. A component material of the counter substrate may be the same as that of the above-described substrate.

[Organic Layer]

The organic compound layer included in the organic light emitting element according to the embodiment of the present disclosure (a hole injection layer, a hole transport layer, an electron blocking layer, a light emitting layer, a hole blocking layer, an electron transport layer, an electron injection layer, and the like) is formed by a method described below.

The organic compound layer included in the organic light emitting element according to an embodiment of the present disclosure can be formed through a dry process, such as a vacuum vapor deposition method, an ionized vapor deposition method, sputtering, and a plasma. Instead of the dry process, a wet process can be used in which the organic compound layer is formed by a known coating method (for example, spin coating, dipping, a casting method, a Langmuir-Blodgett (LB) method, and an ink jet method) using an appropriate solvent in which an organic compound is dissolved.

If the organic compound layer is formed through the vacuum vapor deposition method, the solution coating method, or the like, the formed layer hardly causes crystallization and has excellent stability over time. Further, if a film of the organic compound layer is formed through the coating method, the film can be formed in combination with an appropriate binder resin.

The binder resin includes polyvinylcarbazole resin, polycarbonate resin, polyester resin, ABS resin, acrylic resin, polyimide resin, phenol resin, epoxy resin, silicon resin, and urea resin. These resins are merely examples, and the binder resin is not limited to them.

These binder resins may be used alone as a homopolymer or a copolymer, or may be used by a mixture of two or more resins. Additionally, a known additive, such as a plasticizer, an antioxidant, and an ultraviolet absorber may be used together as needed.

[Application of Display Apparatus]

The display apparatus according to the first to the fourth embodiments can be used as a display unit of various electronic apparatuses. Examples of the electronic apparatuses include a digital camera, a video camera, a head mounted display (a goggle type display), a game machine, a car navigation apparatus, a personal computer, a portable information terminal, an electronic book, and a television receiver. A specific example will be described below with reference to the accompanying drawings.

Figure 9A:
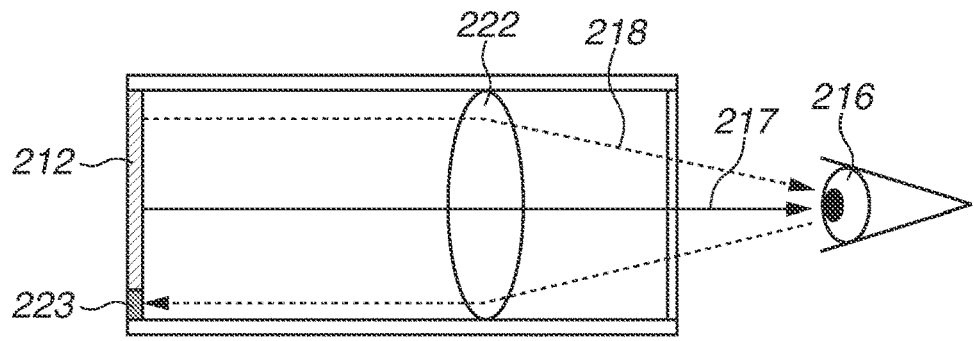
FIGS. 9A, 9B, and 9C are schematic configuration views of an example of a display apparatus according to an embodiment.
Figure 9B:
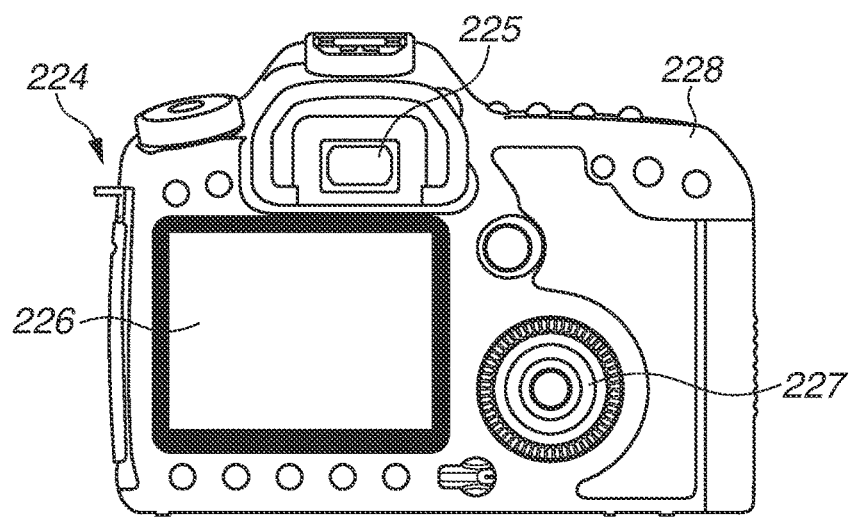
Figure 9C:
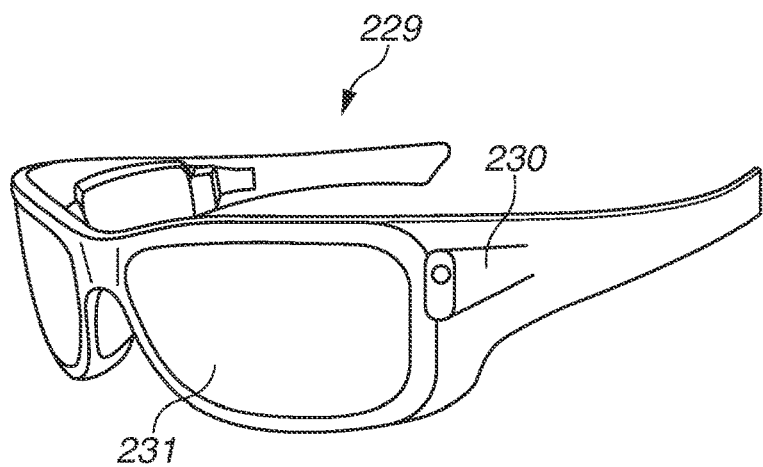

FIGS. 9A, 9B, and 9C each illustrate an application example of the display apparatus according to the first to the fourth embodiments. The display apparatus according to any of the first to the fourth embodiments is applicable to an information display apparatus, such as a viewfinder of a camera, a head mounted display, and smart glasses.

FIG. 9A is a schematic configuration view of an example of the display apparatus used as a viewfinder of an imaging apparatus, such as a camera. The display apparatus 212 emits display light 217 and infrared light 218, and the display light 217 and the infrared light 218 reach an eyeball 216 of a user through a same optical member 222. The infrared light 218 reflected on the eyeball 216 of the user is converted into electrical information by an imaging apparatus 223 including an image pickup element, and a line of sight is detected based on the electrical information. Instead of being provided with the imaging apparatus 223, the display apparatus 212 may be provided with an image pickup element on the insulating layer and be used as a display-and-imaging apparatus.

FIG. 9B illustrates an example of an imaging apparatus, such as a camera. An imaging apparatus 224 includes a viewfinder 225, a display 226, an operation unit 227, and a housing 228. The display apparatus in FIG. 9A is arranged in the viewfinder 225.

FIG. 9A illustrates the example in which the display light 217 and the infrared light 218 pass through the same optical member 222, but optical members may be separately provided for the display light 217 and the infrared light 218. Instead of being provided with the imaging apparatus, the display apparatus may be provided with the image pickup element on the substrate and used as the display-and-imaging apparatus. Information about the detected line of sight (also referred to as line-of-sight information) can be used for control of the display apparatus and various apparatuses connected to the display apparatus, such as focus control of a camera, resolution control of a display image, and substitute of a button operation.

The display apparatus according to an embodiment of the present disclosure may include an imaging apparatus including a light receiving element and control a display image of the display apparatus based on the line-of-sight information of a user from the imaging apparatus.

More specifically, the display apparatus determines a first viewing area gazed by a user and a second viewing area other than the first viewing area based on the line-of-sight information. The first viewing area and the second viewing area may be determined by a control apparatus of the display apparatus, or the first viewing area and the second viewing area determined by an external control apparatus may be received. Display resolution of the first viewing area may be controlled to be higher than display resolution of the second viewing area in a display area of the display apparatus. In other words, the resolution of the second viewing area may be lowered than that of the first viewing area.

The display area includes a first display area and a second display area different from the first display area, and an area having higher priority is determined from the first display area and the second display area based on the line-of-sight information. The first display area and the second display area may be determined by the control apparatus of the display apparatus, or the first display area and the second display area determined by the external control apparatus may be received. Resolution of the area having a higher priority may be controlled to be higher than resolution of an area other than the area having the higher priority. In other words, the resolution of the area having relatively low priority may be lowered.

Artificial intelligence (AI) may be used to determine the first viewing area and the area having a higher priority. The AI may be a model configured to use an image of an eyeball and a direction in which the eyeball in the image is actually looking at as teaching data and to estimate an angle of a line of sight and a distance to a target object ahead of the line of sight from the image of the eyeball. An AI program may be included in the display apparatus, the imaging apparatus, or an external apparatus. In a case where the AI program is included in the external apparatus, the AI program is transmitted to the display apparatus through communication.

In a case where display control is performed based on visual recognition and detection, the display apparatus can be applied to smart glasses which further includes an imaging apparatus that captures an image of the outside. The smart glasses can display information about the captured outside in real time.

In addition, the display apparatus may be provided with a first imaging apparatus that includes a light receiving element for receiving the infrared light and a second imaging apparatus that includes a light receiving element different from that in the first imaging apparatus and captures an image of the outside. Imaging resolution of the second imaging apparatus is controlled based on information about a line of sight of a user of the first imaging apparatus. The resolution of other areas are lowered compared with an area with a higher priority for the imaging resolution, and thus an information amount can be reduced. Accordingly, power consumption and display delay can be reduced. The area with a higher priority may be regarded as a first imaging area, and an area with the priority lower than that of the first imaging area may be regarded as a second imaging area.

FIG. 9C is a schematic view of an example of the smart glasses. A display-and-imaging apparatus 229 represented by the smart glasses includes a control unit 230, a transparent display unit 231, and an external imaging unit (not illustrated). In a case where the display apparatus is applied to the smart glasses, both of the display apparatus and an external imaging apparatus can be controlled based on the detected line-of-sight information, and the power consumption and the display delay can be reduced. For example, in the display area, the display and imaging resolution is lowered in an area other than an area where a user gazes, so that information amounts in both imaging and displaying can be reduced. Thus, the power consumption and the display delay can be reduced.

The display apparatus according to the first to the fourth embodiments can be used as a structural member of a below described display apparatus and a lighting apparatus. In addition, the display apparatus can be applied to an exposure light source of an electrophotographic image forming apparatus, a backlight of a liquid crystal display apparatus, a light emitting apparatus that includes a color filter in a white light source, and the like.

The display apparatus may be an image information processing apparatus which includes an image input unit for inputting image information from an area charge coupled apparatus (CCD), a linear CCD, a memory card, and the like and an information processing unit for processing the input information and displays the input image on a display unit.

The display unit included in the imaging apparatus and an ink-jet printer may have a touch panel function. A method for driving the touch panel function may be an infrared type, a capacitance type, a resistance film type, or an electromagnetic induction type, and is not particularly limited. The display apparatus may be used in the display unit of a multifunction printer.

Figure 10:
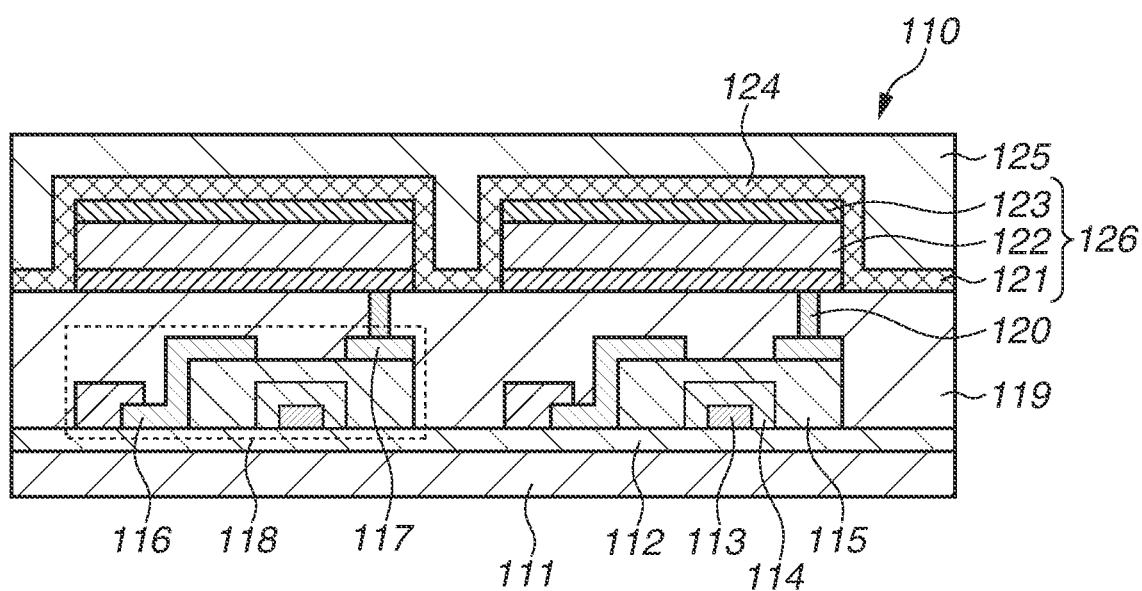
FIG. 10 is a schematic view of an application example of a display apparatus according to an embodiment.

Next, the display apparatus according to the present embodiment will be described with reference to the accompanying drawings. FIG. 10 is a sectional schematic view of an example of the display apparatus including an organic light emitting element and a thin-film transistor (TFT) element connected to the organic light emitting element. The TFT element is an example of an active element.

A display apparatus 110 in FIG. 10 includes a substrate 111, such as glass, and a moisture-proof film 112 provided above the substrate 111 to protect the TFT element or an organic compound layer. The display apparatus 110 further includes a metal gate electrode 113, a gate insulating film 114, and a semiconductor layer 115.

A TFT element 118 includes the semiconductor layer 115, a drain electrode 116, and a source electrode 117. An insulating film 119 is provided above the TFT element 118. An anode 121 and the source electrode 117 which form the organic light emitting element are connected to each other via a contact hole 120.

A method for electrically connecting the electrodes (the anode and the cathode) included in the organic light emitting element and the electrodes (the source electrode and the drain electrode) included in the TFT is not limited to the aspect illustrated in FIG. 10. In other words, either one of the anode and the cathode may be electrically connected to either one of the source electrode and the drain electrode of the TFT element.

In the display apparatus 110 in FIG. 10, the organic compound layer is illustrated as a single layer, but an organic compound layer 122 may include a plurality of layers. A first protective layer 124 and a second protective layer 125 are provided over a cathode 123 to control deterioration of the organic light emitting element.

The display apparatus 110 in FIG. 10 uses the transistor as a switching element but may use a metal-insulator-metal (MIM) element as the switching element instead of the transistor.

The transistor used in the display apparatus 110 in FIG. 10 is not limited to the transistor with a single crystal silicon wafer, and may be a thin-film transistor which includes an active layer on an insulating surface of the substrate. The active layer may include single crystal silicon, amorphous silicon, non-single crystal silicon, such as microcrystalline silicon, and non-single crystal oxide semiconductor, such as indium zinc oxide and indium gallium zinc oxide. A thin-film transistor is also referred to as a TFT element.

The transistor included in the display apparatus 110 in FIG. 10 may be formed within a substrate, such as a silicon (Si) substrate. Herein, the description "to be formed within a substrate" means to manufacture the transistor by processing the substrate, such as the Si substrate, itself. In other words, a fact that the transistor is included within the substrate can be regarded to mean that the substrate and the transistor are integrally formed.

Light emission luminance of the organic light emitting element according to the present embodiment is controlled by the TFT, which is an example of the switching element, and the organic light emitting elements are provided on a plurality of planes and thus can display an image at each light emission luminance. The switching element according to the present embodiment is not limited to the TFT and may be a transistor formed by low-temperature polysilicon and an active matrix driver formed on the substrate such as the Si substrate. The term "on the substrate" can also mean "within the substrate". Whether the transistor is provided within the substrate or the TFT is used is selected based on a size of the display unit and, for example, if the size of the display unit is about 0.5 inches, the organic light emitting element may be provided on the Si substrate.

Figure 11:
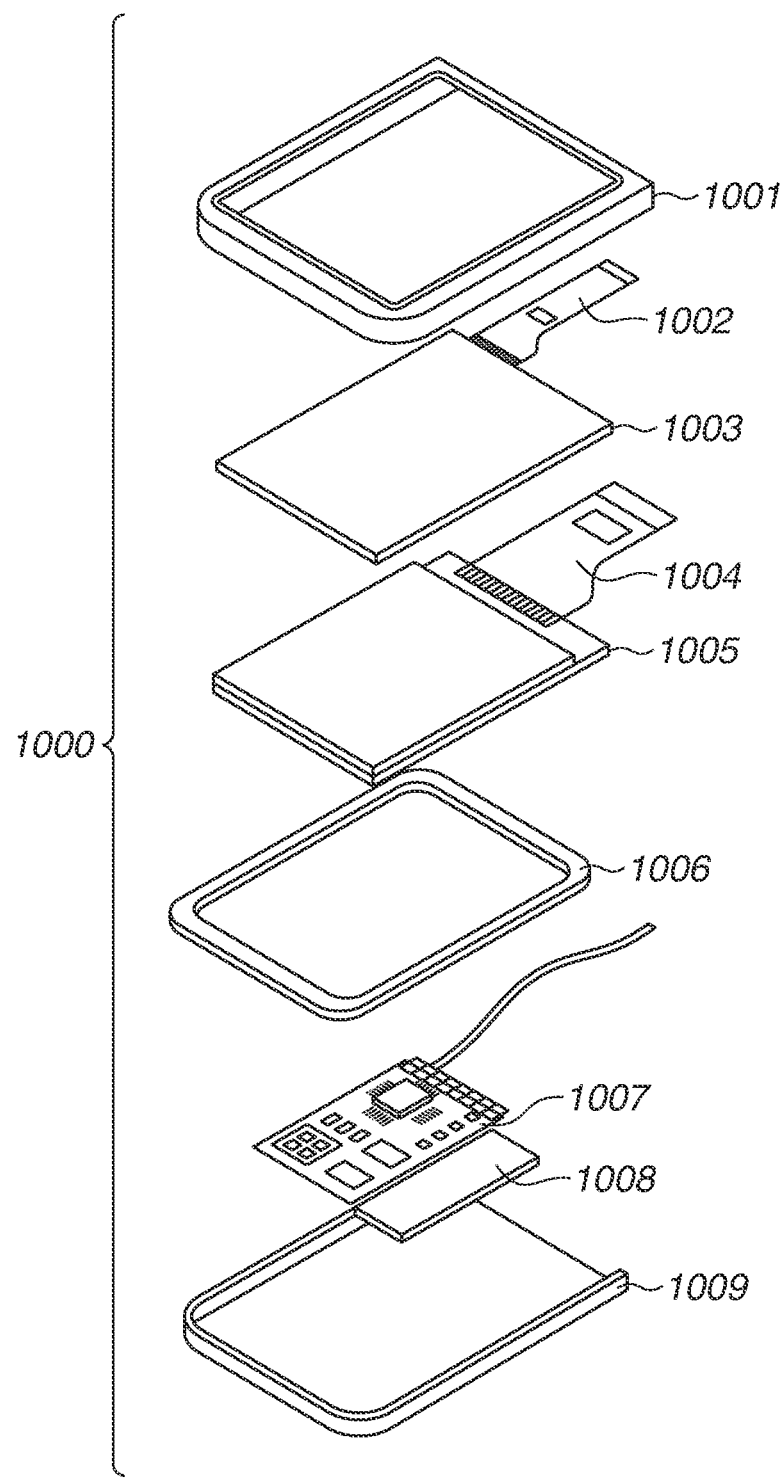
FIG. 11 is a schematic view of an example of a display apparatus according to an embodiment.

FIG. 11 is a schematic view of an example of the display apparatus according to the present embodiment. A display apparatus 1000 may include a touch panel 1003, a display panel 1005, a frame 1006, a circuit board 1007, and a battery 1008 between an upper cover 1001 and a lower cover 1009. The touch panel 1003 and the display panel 1005 are respectively connected to flexible printed circuit boards (FPC) 1002 and 1004. A transistor is printed on the circuit board 1007. The battery 1008 may not be provided if the display apparatus is not a portable apparatus or may be provided another position even if the display apparatus is the portable apparatus.

The display apparatus according to the present embodiment may be used for a display unit of a photoelectric conversion apparatus which includes an optical unit including a plurality of lenses and an image pickup element for receiving light that has passed through the optical unit. The photoelectric conversion apparatus may include the display unit which displays information obtained by the image pickup element. The photoelectric conversion apparatus may obtain information using the information obtained by the image pickup element, and the display unit may display information different from the obtained one. The display unit may be exposed to the outside of the photoelectric conversion apparatus or may be arranged in a finder. The photoelectric conversion apparatus may be a digital camera and a digital video camera.

Figure 12A:
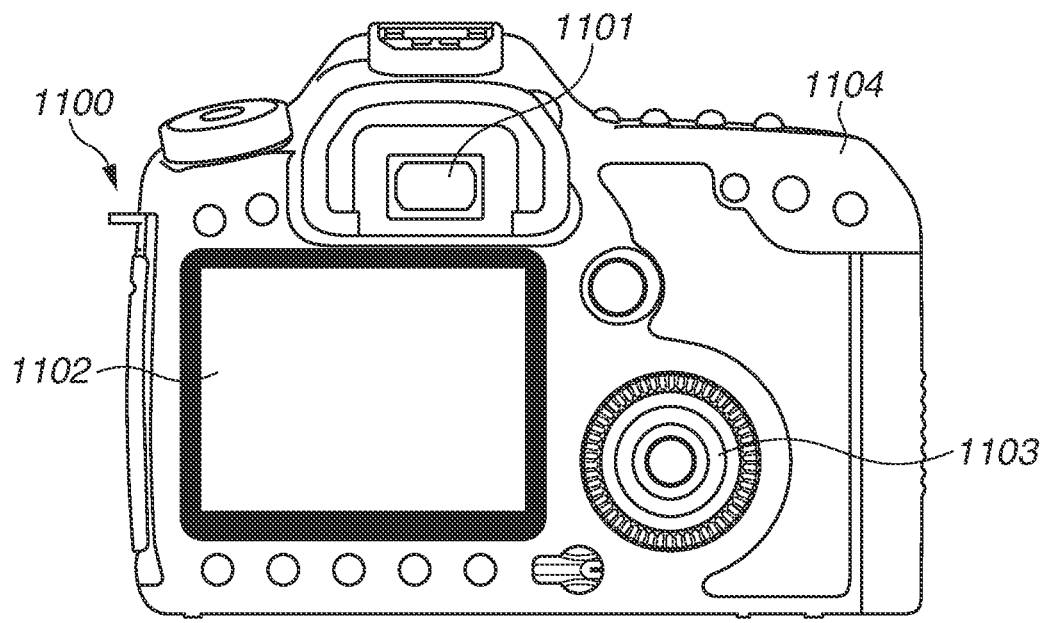
FIGS. 12A and 12B are each a schematic view of an example of an imaging apparatus and an electronic apparatus, respectively, according to an embodiment.

FIG. 12A is a schematic view of an example of the photoelectric conversion apparatus according to the present embodiment. A photoelectric conversion apparatus 1100 may include a viewfinder 1101, a rear display 1102, an operation unit 1103, and a housing 1104. The viewfinder 1101 may include the display apparatus according to any of the first to the fourth embodiments. In such a case, the display apparatus may display not only an image to be captured but also environmental information, an imaging instruction, and the like. The environmental information may include intensity and a direction of external light, a moving speed of an object, and a possibility that the object is shielded by a shielding material.

A timing suitable for imaging is a short time, so that the information is to be displayed as quick as possible. Accordingly, the display apparatus using the organic light emitting element according to the present disclosure may be used. This is because the organic light emitting element has a high response speed. As described above, the display apparatus using the organic light emitting element is more suitable than a liquid crystal display apparatus for the above-described apparatuses which require a high display speed.

The photoelectric conversion apparatus 1100 includes the optical unit which is not illustrated. The optical unit includes a plurality of lenses and forms an image on the image pickup element stored in the housing 1104. The adjusting of the relative positions of the plurality of lenses adjusts a focus. This adjustment operation can be automatically performed.

The display apparatus according to the present embodiment may include a color filter having red, green, and blue. In the color filter, red, green, and blue are arranged in delta arrangement.

The display apparatus according to the present embodiment may be used for a display unit of a mobile terminal. In such a case, the display apparatus may have both the display function and the operation function. The mobile terminal includes a mobile phone, such as a smartphone, and a tablet as well as the above-described head mounted display.

Figure 12B:
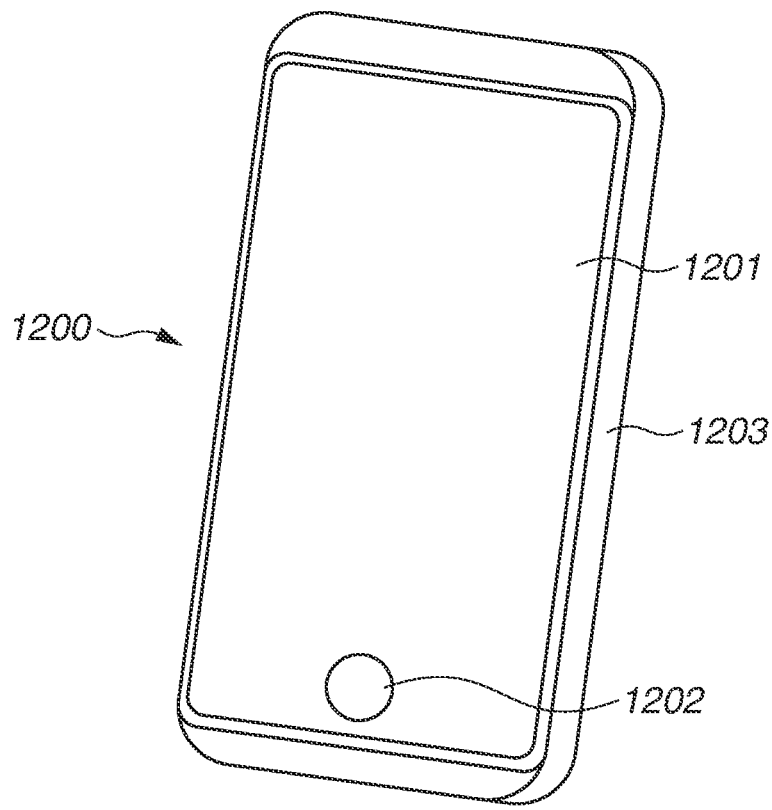

FIG. 12B is a schematic view of an example of an electronic apparatus according to the present embodiment. An electronic apparatus 1200 includes a display unit 1201, an operation unit 1202, and a housing 1203. The housing 1203 may include a circuit, a printed board including the circuit, a battery, and a communication unit. The operation unit 1202 may be a button or a touch panel type reaction unit. The operation unit 1202 may be a living body recognition unit which recognizes a fingerprint to perform, for example, release of a lock. The electronic apparatus including a communication unit may be regarded as a communication apparatus. The display unit may include the display apparatus according to any of the first to the fourth embodiments.

Figure 13A:
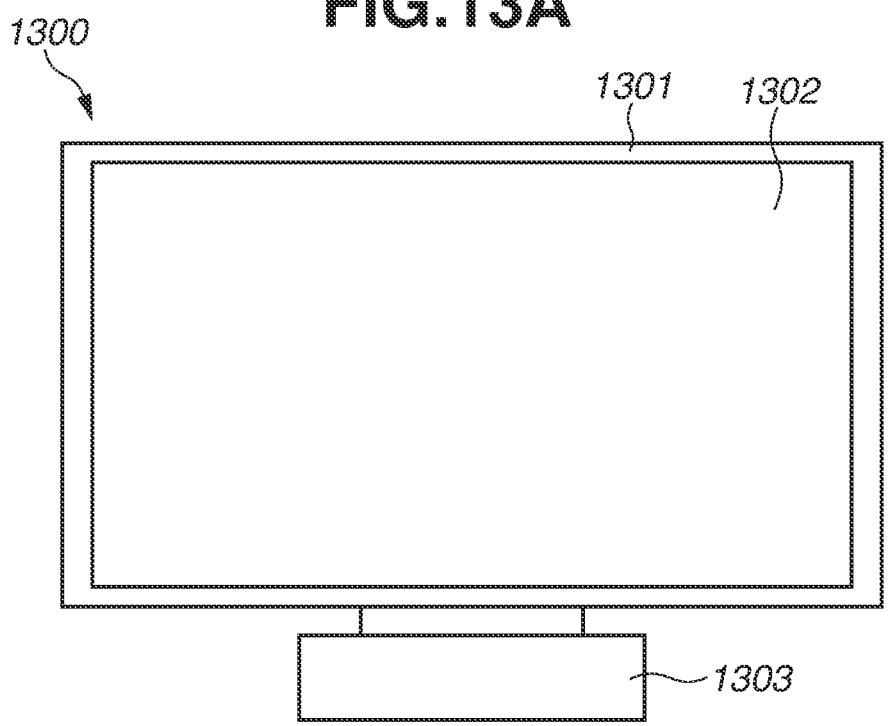
FIGS. 13A and 13B are each a schematic view of an example of a display apparatus and a foldable display apparatus, respectively, according to an embodiment.
Figure 13B:
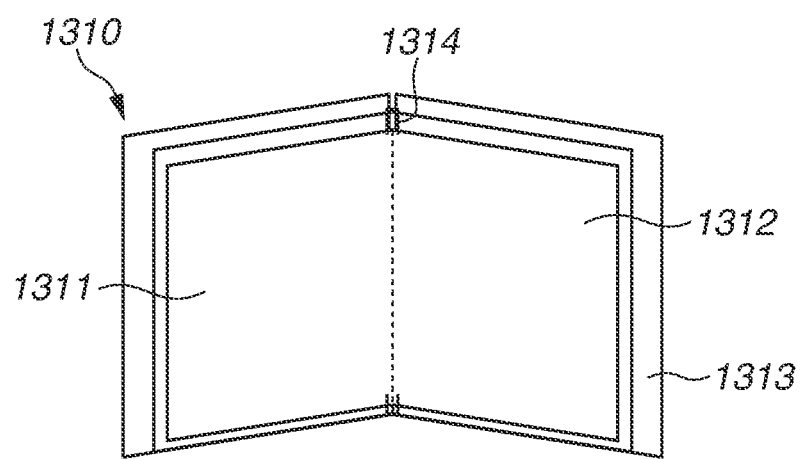

FIGS. 13A and 13B are each a schematic view of an example of the display apparatus according to the present embodiment. FIG. 13A illustrates the display apparatus such as a television monitor and a personal computer (PC) monitor. A display apparatus 1300 includes a frame 1301 and a display unit 1302. The display apparatus according to the first to the fourth embodiments may be used in the display unit 1302.

The display apparatus includes a base 1303 which supports the frame 1301 and the display unit 1302. The base 1303 is not limited to a form illustrated in FIG. 13A. A lower part of the frame 1301 may serve as the base 1303.

The frame 1301 and the display unit 1302 may be bent. The curvature radii thereof may be 5000 mm or more and 6000 mm or less.

FIG. 13B is a schematic view of another example of the display apparatus according to the present embodiment. A display apparatus 1310 in FIG. 13B is configured to be foldable and is a foldable display apparatus. The display apparatus 1310 includes a first display unit 1311, a second display unit 1312, a housing 1313, and a bend point 1314. The first display unit 1311 and the second display unit 1312 may include the light emitting apparatus according to any of the first to the fourth embodiments. The first display unit 1311 and the second display unit 1312 may be a single display apparatus without a joint. The first display unit 1311 and the second display unit 1312 may be separated at the bend point 1314. The first display unit 1311 and the second display unit 1312 may respectively display different images and may display one image together.

Figure 14A:
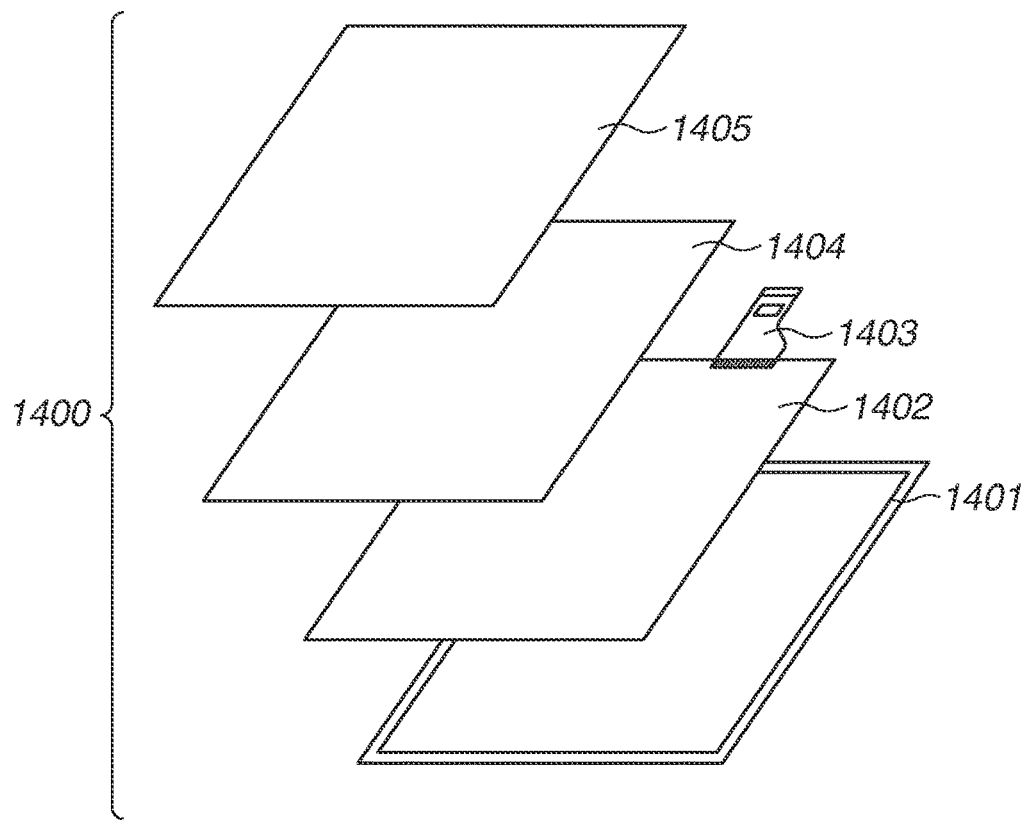
FIG. 14A is a schematic view of an example of a lighting apparatus according to an embodiment.

FIG. 14A is a schematic view of an example of a lighting apparatus according to the present embodiment. A lighting apparatus 1400 may include a housing 1401, a light source 1402, a circuit board 1403, an optical film 1404, and a light diffusion unit 1405. The light source 1402 may include the display apparatus according to any of the first to the fourth embodiments. In such a case, image data to be input to each pixel does not form an image in a case where the data is displayed but may be a signal corresponding to the same luminance.

An optical filter may be a filter which improves a color rendering property of the light source 1402. The light diffusion unit 1405 can effectively diffuse the light from the light source 1402, such as lighting up, and send the light to a wide range. The optical filter and the light diffusion unit 1405 may have transparency and be arranged on a light emitting side of the lighting apparatus 1400. If necessary, a cover may be provided on an outermost side of the lighting apparatus 1400.

The lighting apparatus is, for example, an apparatus illuminating an interior of a room. The lighting apparatus may emit light of white, daytime white, or any other color from blue to red. The lighting apparatus may include a light control circuit for controlling the above-described light. The lighting apparatus may include the organic light emitting element according to the present disclosure and a power source circuit connected thereto. The power source circuit converts an AC voltage into a DC voltage. White has a color temperature of 4200 K, and daytime white has a color temperature of 5000 K. The lighting apparatus may include the color filter.

The lighting apparatus according to the present embodiment may include a heat dissipation unit. The heat dissipation unit dissipates heat inside the apparatus to the outside and may include a metal having a high specific heat and liquid silicon.

Figure 14B:
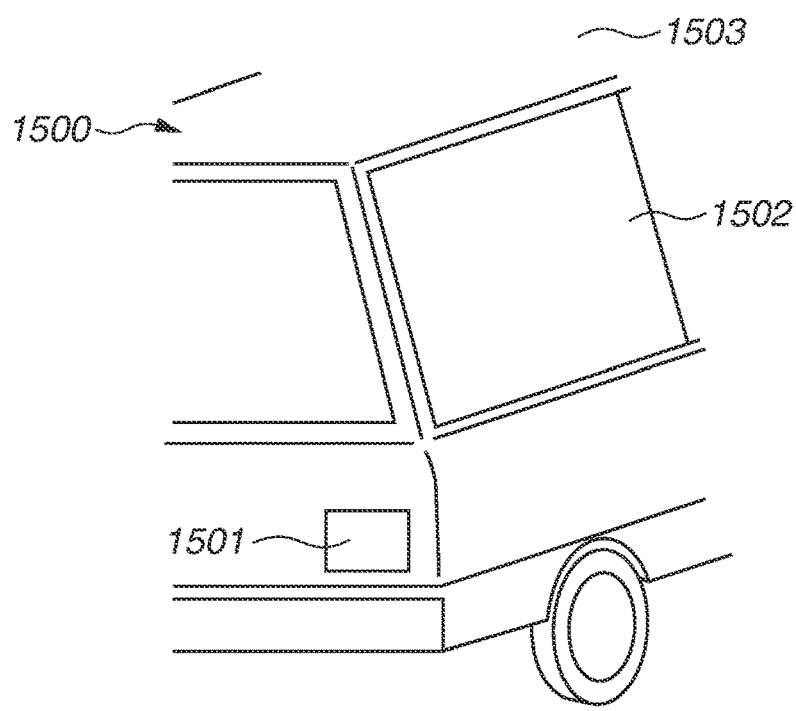
FIG. 14B is a schematic view of an example of a vehicle including a vehicle lighting tool according to an embodiment.

FIG. 14B is a schematic view of a vehicle as an example of a mobile body according to the present embodiment. The vehicle includes a tail lamp as an example of a lighting tool. A vehicle 1500 includes a tail lamp 1501 which is lit in a case where a brake operation and the like is performed.

The tail lamp 1501 may include the display apparatus according to any of the first to the fourth embodiments as the lighting apparatus. The tail lamp 1501 may include a protection member for protecting an organic EL element. The protection member may be made of any material that has high strength to some extent and is transparent and may be made of polycarbonate and the like. Polycarbonate may be mixed with a furan dicarboxylic acid derivative, an acrylonitrile derivative, and the like.

The vehicle 1500 may include a vehicle body 1503 and a window 1502 mounted on the vehicle body 1503. The window 1502 may be a transparent display if the window is not used to check the front and rear of the vehicle. The transparent display may include the display apparatus according to any of the first to the fourth embodiments. In such a case, a transparent member is used as a component material of electrodes and the like included in the organic light emitting element.

The mobile body according to the present embodiment may be a ship, an aircraft, a drone, and the like. The mobile body may include a body and a lighting tool provided to the body. The lighting tool may emit light to indicate a position of the body. The lighting tool includes the display apparatus according to any of the first to the fourth embodiments as the lighting apparatus.

As described above, the use of the display apparatus according to any of the first to the fourth embodiments achieves the display that has an excellent image quality and is stable for a long time.

As described above, according to the present disclosure, a display apparatus of which an image quality is improved can be provided.

While the disclosure has been described with reference to embodiments, it is to be understood that the disclosure is not limited to the disclosed embodiments. The scope of the following claims is to be accorded the broadest interpretation so as to encompass all such modifications and equivalent structures and functions.

This application claims the benefit of Japanese Patent Application No. 2019-198013, filed Oct. 30, 2019 which is hereby incorporated by reference herein in its entirety.

What is claimed is:

1. A display apparatus comprising:
   a first light emitting element;
   a data signal output unit configured to output signals for controlling a light emission luminance of the first light emitting element;
   a first transistor connected to the first light emitting element and including a gate, and configured to output a current based on a signal of the signals;
   a first capacitive element including a first node and a second node;
   a second transistor provided on a first input path through which a signal of the signals is input to the gate; and
   a third transistor provided on a second input path through which a signal of the signals is input to the gate and which is different from the first input path,
   wherein the first node is connected to the second transistor, the third transistor, and the gate, and
   wherein the second node is configured to be supplied with a power source potential.

2. The display apparatus according to claim 1,
   wherein the first input path includes a first signal line that is connected to the data signal output unit; and
   wherein the second input path includes a second signal line that is connected to the data signal output unit and is different from the first signal line.

3. The display apparatus according to claim 2, wherein a source or a drain included in the first transistor is connected to the first light emitting element.

4. The display apparatus according to claim 2, wherein, in a case where the second transistor is in an ON state, the first signal line is in a floating state, and in a case where the third transistor is in an ON state, the second signal line is in the floating state.

5. The display apparatus according to claim 2, further comprising:
a second light emitting element;
a third input path through which a signal from the data signal output unit is input to the second light emitting element; and
a fourth input path through which a signal from the data signal output unit is input to the second light emitting element and which is different from the third input path,
wherein the third input path includes the first signal line, and
wherein the fourth input path includes the second signal line.

6. The display apparatus according to claim 5,
wherein, in a first frame period, a signal from the data signal output unit is input to the first light emitting element via the first input path in a state in which the second input path is electrically interrupted, and a signal from the data signal output unit is input to the second light emitting element via the fourth input path in a state in which the third input path is electrically interrupted, and
wherein, in a second frame period following the first frame period, a signal from the data signal output unit is input to the first light emitting element via the second input path in a state in which the first input path is electrically interrupted, and a signal from the data signal output unit is input to the second light emitting element via the third input path in a state in which the fourth input path is electrically interrupted.

7. The display apparatus according to claim 6, wherein the first light emitting element and the second light emitting element are next to each other in a direction parallel to the first signal line.

8. The display apparatus according to claim 2, further comprising:
a third light emitting element;
a fifth input path through which a signal from the data signal output unit is input to the third light emitting element; and
a sixth input path through which a signal from the data signal output unit is input to the third light emitting element and which is different from the fifth input path,
wherein the fifth input path includes a third signal line which is different from the first signal line and the second signal line,
wherein the sixth input path includes a fourth signal line which is different from the first signal line, the second signal line, and the third signal line,
wherein a parasitic capacitance of the first signal line is greater than a parasitic capacitance of the second signal line, and a parasitic capacitance of the third signal line is greater than a parasitic capacitance of the fourth signal line,
wherein, in a first frame period, a signal from the data signal output unit is input to the first light emitting element via the first input path in a state in which the second input path is electrically interrupted, and a signal from the data signal output unit is input to the third light emitting element via the sixth input path in a state in which the fifth input path is electrically interrupted, and
wherein, in a second frame period following the first frame period, a signal from the data signal output unit is input to the first light emitting element via the second input path in a state in which the first input path is electrically interrupted, and a signal from the data signal output unit is input to the third light emitting element via the fifth input path in a state in which the sixth input path is electrically interrupted.

9. The display apparatus according to claim 8, further comprising:
a fourth light emitting element; and
a seventh input path through which a signal from the data signal output unit is input to the fourth light emitting element,
wherein the seventh input path includes a fifth signal line which is different from the first to the fourth signal lines and a fourth transistor, and
wherein an input path for the signal from the data signal output unit to the fourth light emitting element is only the seventh input path.

10. The display apparatus according to claim 9,
wherein a pixel including the first light emitting element is a pixel which emits light of a first color, and
wherein a pixel including the third light emitting element is a pixel which emits light of a second color different from the first color.

11. The display apparatus according to claim 1,
wherein a signal from the data signal output unit is input to the first light emitting element via the first input path in a state in which the second input path is electrically interrupted at a first time, and
wherein a signal from the data signal output unit is input to the first light emitting element via the second input path in a state in which the first input path is electrically interrupted at a second time different from the first time.

12. A photoelectric conversion apparatus comprising:
an optical unit including a plurality of lenses;
an image pickup element configured to receive light that has passed through the optical unit; and
a display unit configured to display an image captured by the image pickup element,
wherein the display unit includes the display apparatus according to claim 1.

13. An electronic apparatus comprising:
a display unit including the display apparatus according to claim 1;
a housing provided with the display unit; and
a communication unit arranged in the housing and configured to communicate with an outside.

14. A lighting apparatus comprising:
a light source including the display apparatus according to claim 1; and
a light diffusion unit or an optical film through which light emitted from the light source passes.

15. A mobile body comprising:
a lighting tool including the display apparatus according to claim 1; and
a body provided with the lighting tool.

16. The display apparatus according to claim 1,
wherein in one pixel, a number of transistors included in the first input path is a same as a number of transistors included in the second input path.

17. The display apparatus according to claim 1, further comprising
a plurality of signal selection circuits, each of the plurality of signal selection circuits being connected to a plurality of signal lines,
wherein the data signal output unit is configured to output the signals to the plurality of signal selection circuits, and
each of the plurality of signal selection circuits is configured to sequentially select the signals to output to the plurality of signal lines.

18. A display apparatus comprising:
a plurality of pixels, each of the plurality of pixels including a first light emitting element;
a plurality of signal lines; and
a data signal output unit configured to output signals for controlling a light emission luminance of the first light emitting element,
wherein each of the plurality of pixels further includes:
a first transistor connected to either one of a source and a drain of the first light emitting element, and configured to output a current based on a signal of the signals;
a second transistor arranged between one of the plurality of signal lines and configured to supply a signal of the signal to a gate of the first transistor; and
a third transistor arranged between a signal line different from the one of the plurality of signal lines and configured to supply a signal of the signal to the gate of the first transistor.

19. The display apparatus according to claim 1,
wherein the third transistor is not connected to a path between the first transistor and the first light emitting element.

20. An information display apparatus comprising:
an image pickup element; and
the display apparatus according to claim 18,
wherein a display image of the display apparatus is controlled based on information about a line of sight of a user from the image pickup element.

21. A photoelectric conversion apparatus comprising:
an optical unit including a plurality of lenses;
an image pickup element configured to receive light that has passed through the optical unit; and
a display unit configured to display an image captured by the image pickup element,
wherein the display unit includes the display apparatus according to claim 18.

22. An electronic apparatus comprising:
a display unit including the display apparatus according to claim 18;
a housing provided with the display unit; and
a communication unit arranged in the housing and configured to communicate with an outside.

23. A lighting apparatus comprising:
a light source including the display apparatus according to claim 18; and
a light diffusion unit or an optical film through which light emitted from the light source passes.

24. A mobile body comprising:
a lighting tool including the display apparatus according to claim 18; and
a body provided with the lighting tool.

25. A display apparatus comprising:
a first light emitting element;
a data signal output unit configured to output signals for controlling a light emission luminance of the first light emitting element;
a first transistor connected to the first light emitting element and including a gate, and configured to output a current based on a signal of the signals;
a first capacitive element including a first node and a second node;
a first input path through which a signal of the signals is input to the gate; and
a second input path through which a signal of the signals is input to the gate and which is different from the first input path,
wherein a signal corresponding to a first light emitting amount is supplied to the gate through the first input path, and
wherein a signal corresponding to a second light emitting amount is supplied to the gate through the second input path.

26. The display apparatus according to claim 1,
wherein the data signal output unit is configured to perform horizontal scanning.

27. An information display apparatus comprising:
an image pickup element; and
the display apparatus according to claim 25,
wherein a display image of the display apparatus is controlled based on information about a line of sight of a user from the image pickup element.

28. A photoelectric conversion apparatus comprising:
an optical unit including a plurality of lenses;
an image pickup element configured to receive light that has passed through the optical unit; and
a display unit configured to display an image captured by the image pickup element,
wherein the display unit includes the display apparatus according to claim 25.

29. An electronic apparatus comprising:
a display unit including the display apparatus according to claim 25;
a housing provided with the display unit; and
a communication unit arranged in the housing and configured to communicate with an outside.

30. A lighting apparatus comprising:
a light source including the display apparatus according to claim 25; and
a light diffusion unit or an optical film through which light emitted from the light source passes.

31. A mobile body comprising:
a lighting tool including the display apparatus according to claim 25; and
a body provided with the lighting tool.

32. An information display apparatus comprising:
an image pickup element; and
the display apparatus according to claim 1,
wherein a display image of the display apparatus is controlled based on information about a line of sight of a user from the image pickup element.

* * * * *